(12) United States Patent
Nakao et al.

(10) Patent No.: US 7,155,649 B2
(45) Date of Patent: Dec. 26, 2006

(54) SCAN TEST CONTROL METHOD AND SCAN TEST CIRCUIT

(75) Inventors: Toshinobu Nakao, Takatsuki (JP); Shinji Ozaki, Suita (JP); Tomohisa Sezaki, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 432 days.

(21) Appl. No.: 10/722,752

(22) Filed: Nov. 26, 2003

(65) Prior Publication Data

US 2004/0181723 A1 Sep. 16, 2004

(30) Foreign Application Priority Data

Mar. 12, 2003 (JP) ............... 2003-067170

(51) Int. Cl.
*G01R 31/28* (2006.01)

(52) U.S. Cl. ..................................... 714/726
(58) Field of Classification Search .................. None
See application file for complete search history.

(56) References Cited

U.S. PATENT DOCUMENTS

| 5,285,153 | A | * | 2/1994 | Ahanin et al. | ............. | 324/73.1 |
|---|---|---|---|---|---|---|
| 5,524,114 | A | * | 6/1996 | Peng | ............ | 714/724 |
| 6,651,181 | B1 | * | 11/2003 | Lacey | ............ | 713/503 |
| 6,671,848 | B1 | * | 12/2003 | Mulig et al. | ............ | 714/744 |
| 6,763,489 | B1 | * | 7/2004 | Nadeau-Dostie et al. | ... | 714/731 |
| 6,877,123 | B1 | * | 4/2005 | Johnston et al. | ............ | 714/731 |
| 7,007,213 | B1 | * | 2/2006 | Wang et al. | ............ | 714/729 |
| 2002/0138801 | A1 | * | 9/2002 | Wang et al. | ............ | 714/729 |
| 2002/0199144 | A1 | | 12/2002 | Yamauchi | | |
| 2003/0009714 | A1 | * | 1/2003 | Evans | ............ | 714/726 |
| 2003/0021464 | A1 | * | 1/2003 | Takeoka et al. | ............ | 382/145 |
| 2003/0070118 | A1 | * | 4/2003 | Nakao et al. | ............ | 714/30 |
| 2004/0268181 | A1 | * | 12/2004 | Wang et al. | ............ | 714/30 |

FOREIGN PATENT DOCUMENTS

JP 2002351694 12/2002

* cited by examiner

*Primary Examiner*—Guy Lamarre
*Assistant Examiner*—John P. Trimmings
(74) *Attorney, Agent, or Firm*—Peter J. Bilinski

(57) ABSTRACT

A scan test circuit is provided with a scan chain having n pieces of scan storage elements (n: integer, n>1); a scan clock generation circuit which is able to control a frequency of a first clock to be used for shifting data into the first to (n−1)th scan storage elements, and a frequency of a second clock to be used for shifting data into the n-th scan storage element and performing actual operation, independently from each other; and a scan selection internal signal generation circuit for generating a scan selection internal signal that is synchronized with the second clock.

14 Claims, 15 Drawing Sheets

SCAN TEST CONTROL METHOD AND SCAN TEST CIRCUIT

FIELD OF THE INVENTION

The present invention relates to a scan test control method and a scan test circuit for detecting a stuck-at fault and a delay fault that occur in a semiconductor integrated circuit.

BACKGROUND OF THE INVENTION

In recent years, it has become possible to integrate several millions of transistors in one chip, as semiconductor fine-patterning techniques have progressed. As one of test methods for such semiconductor integrated circuit, there is a scan test that ensures an extremely high rate of fault detection.

FIG. 18 is a block diagram illustrating a conventional scan test circuit. In FIG. 18, the scan test circuit comprises external input terminals 111, 112, and 114, a combination circuit 118, normal data lines 119~121, an external output terminal 124, and a scan chain having n (n>1) pieces of scan storage elements. The scan test circuit shown in FIG. 18 has three (n=3) scan storage elements 125~127. Further, the scan test circuit has an output data line 122 of the scan storage element 125, and an output data line 123 of the scan storage element 126.

The external input terminal 111 receives a scan selection external signal for switching between normal operation and scan operation. The external input terminal 112 receives scan-in data. The external input terminal 114 receives a test clock. The scan storage elements 125~127 hold and output the data in synchronization with the rising edge of the test clock inputted to the external input terminal 114. The external output terminal 124 outputs the output data of the scan storage element 127. The combination circuit 118 receives the data from the output data lines 122 and 123, and outputs the data to the normal data lines 119~121. The scan test circuit shown in FIG. 18 tests the combination circuit 118.

FIG. 19 is a circuit diagram illustrating a concrete example of the scan storage elements 125~127. In FIG. 19, the scan storage element comprises a selector circuit 1, a scan selection signal input terminal 2, a normal data input terminal 3, a scan-in input terminal 4, a scan clock input terminal 5, a storage element 6, and an output terminal 7.

The normal data input terminal 3 receives normal data. The scan-in input terminal 4 receives scan-in data. The scan clock input terminal 5 receives a scan clock. The scan selection signal input terminal 2 receives a scan selection external signal that is described later. The selector circuit 1 receives the normal data, the scan-in data, and the scan selection external signal, and outputs the normal data when the scan selection external signal is "0", or outputs the scan-in data when the scan selection external signal is "1". The storage element 6 holds and outputs the output signal of the selector circuit 1 in synchronization with the rising edge of the scan clock inputted to the scan clock input terminal 5. The output terminal 7 outputs the signal that is outputted from the storage element 6, to the outside.

FIG. 20 is a time chart for explaining the operation of the scan test circuit constituted as described above. In FIG. 20, reference numerals 1200~1204 denote scan-in data inputted to the external input terminal 112, numerals 1210~1212, 1250 and 1251 denote normal data on the normal data line 119, numerals 1220~1222, 1260 and 1261 denote normal data on the normal data line 120, numerals 1230~1232, 1270 and 1271 denote normal data on the normal data line 121, numeral 1198 denotes initial data that is stored in the scan storage element 127 during scan operation, and numeral 1199 denotes initial data that is stored in the scan storage element 126 during scan operation. Further, reference numerals 350~355 indicate event timings. Other reference numerals denote the waveforms of signals at the signal lines and external terminals corresponding to the reference numerals shown in FIG. 18.

Hereinafter, the operation of the scan test circuit will be described with reference to FIGS. 18~20. When the scan selection external signal inputted to the external input terminal 111 is "0", the scan storage elements 125~127 are in the normal operation mode, and perform the normal operation. That is, these elements serve as normal storage elements. To be specific, in synchronization with the rising edge of the test clock inputted to the external input terminal 114, the scan storage element 125 holds and outputs the normal data supplied from the normal data line 119, the scan storage element 126 holds and outputs the normal data supplied from the normal data line 120, and the scan storage element 127 holds and outputs the normal data supplied from the normal data line 121.

When the scan selection external signal inputted to the external input terminal 111 is "1", the scan storage elements 125~127 are in the scan mode, and perform the scan operation. That is, these elements serve as storage elements performing scan operation. To be specific, in synchronization with the rising edge of the test clock inputted to the external input terminal 114, the scan storage element 125 holds and outputs the scan-in data inputted to the external input terminal 112, the scan storage element 126 holds and outputs the output data of the scan storage element 125, and the scan storage element 127 holds and outputs the output data of the scan storage element 126.

Since the scan selection external signal is "1" at the event timing 350, the scan storage elements 125~127 are in the scan mode. In synchronization with the rising edge of the test clock, the scan storage element 125 holds and outputs the scan-in data 1201 inputted to the external input terminal 112, the scan storage element 126 holds and outputs the output data 1200 of the scan storage element 125, and the scan storage element 127 holds and outputs the output data 1199 of the scan storage element 126. The external output terminal 124 outputs the output data 1199 of the scan storage element 127.

Since the scan selection external signal is "1" at the event timing 351, the scan storage elements 125~127 are in the scan mode. In synchronization with the rising edge of the test clock, the scan storage element 125 holds and outputs the scan-in data 1202 supplied from the external input terminal 112, the scan storage element 126 holds and outputs the output data 1201 of the scan storage element 125, and the scan storage element 127 holds and outputs the output data of the scan storage element 126. The external output terminal 124 outputs the output data 1200 of the scan storage element 127.

The scan selection external signal transits to "0" at the event timing 352, and the scan storage elements 125~127 are switched into the normal operation mode.

At the event timing 353, in synchronization with the rising edge of the test clock, the scan storage element 125 holds and outputs the normal data 1212 supplied from the normal data line 119, the scan storage element 126 holds and outputs the normal data 1222 supplied from the normal data line 120, and the scan storage element 127 holds and outputs the normal data 1232 supplied from the normal data line 121.

The external output terminal 124 outputs the output data 1232 of the scan storage element 127.

At the event timing 354, the scan selection external signal transits to "1", and the scan storage elements 125~127 are switched into the scan mode.

At the event timing 355, in synchronization with the rising edge of the test clock, the scan storage element 125 holds and outputs the scan-in data 1204 supplied from the external input terminal 112, the scan storage element 126 holds and outputs the output data 1212 of the scan storage element 125, and the scan storage element 127 holds and outputs the output data 1222 of the scan storage element 126. The external output terminal 124 outputs the output data 1222 of the scan storage element 127.

As described above, according to the conventional scan test circuit and scan test control method, in the scan test circuit having the scan chain including the n pieces of scan storage elements (n: integer, n>0), the scan-in data are set in the scan storage element 125~127 in the scan mode, and the normal data outputted from the combination circuit 118 in the normal operation mode are stored in the scan storage elements 125~127, respectively, and then the normal data stored in the scan storage elements 125~127 in the scan mode are shifted-in and outputted to the outside through the external output terminal 124 (scan out) to be observed, thereby detecting a fault in the semiconductor integrated circuit (for example, refer to "Design of Testable Logic Circuit", written by R. G. Bennett, translated by Akemi Harada).

In the conventional scan test circuit and scan test control method, the scan-in data and the scan selection signal must be directly input to the scan storage elements in the semiconductor integrated circuit from the outside of the semiconductor integrated circuit. Therefore, the rate of data flow is determined at the I/O of the semiconductor integrated circuit and, as the result, the scan test cannot be carried out at the normal operation speed. Accordingly, in a semiconductor integrated circuit that ensures a high-speed frequency, the conventional scan test circuit and scan test control method cannot detect a delay fault that depends on the frequency while they can detect a stuck-at fault that does not depend on the frequency.

SUMMARY OF THE INVENTION

The present invention is made to solve the above-described problems and has for its object to provide a scan test circuit and a scan test control method that are able to detect not only a stuck-at fault but also a delay fault even when shift-in data and a scan selection external signal are supplied from the outside of a semiconductor integrated circuit as in the conventional scan test circuit and scan test control method.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a scan test control method for a scan test circuit having a scan chain including n pieces of scan storage elements (n: integer, n>1), wherein a frequency of a first clock to be used for shifting data into the first to (n−1)th scan storage elements, and a frequency of a second clock to be used for shifting data into the n-th scan storage element and performing normal operation, are independently controlled. Therefore, it is possible to realize compatibility between a stable scan operation of inputting shift-in data into the scan storage elements and a normal operation, which results in effective detection of a delay fault as well as effective detection of a stuck-at fault in a semiconductor integrated circuit.

According to a second aspect of the present invention, in the scan test control method according to the first aspect, the frequency of the first clock and the frequency of the second clock are different from each other.

According to a third aspect of the present invention, in the scan test control method according to the first aspect, the frequency of the second clock is a clock frequency to be used in the normal operation.

According to a fourth aspect of the present invention, there is provided a scan test circuit comprising: a scan chain having n pieces of scan storage elements (n: integer, n>1); a scan clock generation circuit for receiving first and second clocks, and outputting one of the first clock and the second clock as a scan clock for operating the plural scan storage elements; and a selection circuit for selecting the first clock as the scan clock to be used for shifting data into the first to (n−1)th scan storage elements, and selecting the second clock as the scan clock to be used for shifting data into the n-th scan storage element and performing normal operation. Therefore, it is possible to realize compatibility between a stable scan operation of inputting shift-in data into the scan storage elements and a normal operation, which results in effective detection of a delay fault as well as effective detection of a stuck-at fault in a semiconductor integrated circuit.

According to a fifth aspect of the present invention, the scan test circuit according to the fourth aspect further includes a scan selection signal generation circuit which receives, from the outside, a scan selection external signal for switching between normal operation and scan test operation, and generates a scan selection internal signal for selectively switching between normal operation and operation for shifting data into the plural scan storage elements in synchronization with the second clock.

According to a sixth aspect of the present invention, in the scan test circuit according to the fifth aspect, the scan selection signal generation circuit generates a control signal for generating an arbitrary number of the second clocks.

According to a seventh aspect of the present invention, in the scan test circuit according to the sixth aspect, the scan selection signal generation circuit switches between a first timing at which the scan clock generation circuit generates the second clock as the scan clock, and a second timing at which the scan selection internal signal is generated.

According to an eighth aspect of the present invention, in the scan test circuit according to the seventh aspect, the scan selection signal generation circuit arbitrarily selects one of the first timing and the second timing.

According to a ninth aspect of the present invention, in the scan test circuit according to the eighth aspect, a storage element is provided in front of the scan chain. Therefore, the data stored in the scan storage elements during the normal operation become identical to those stored during the conventional scan test, whereby the shift-in data in the conventional scan test can be scan-tested as they are. Further, the detection rate of stuck-at fault in a semiconductor integrated circuit can be equal to that in the conventional scan test.

According to a tenth aspect of the present invention, in the scan test circuit according to the ninth aspect, when generating a scan test pattern, the scan clock generation circuit is replaced with a circuit that connects a terminal to which the first clock is input, directly to a signal line from which the scan clock is output; the scan selection signal generation circuit is replaced with a circuit that connects a terminal to which the scan selection external signal is input, directly to a signal line from which the scan selection internal signal is output; and the storage element is replaced with a circuit that connects a signal line to which data in the storage element is input, directly to a signal line from which the data is output. Therefore, even when there is a scan design protocol defining that a scan selection external signal supplied from the outside of a semiconductor integrated circuit must be the same as a scan selection internal signal, and scan-in data supplied from the outside of the semiconductor integrated circuit and scan-in data inputted to scan storage elements must be synchronized with each other by a single clock, it is possible to generate a scan test pattern without infringing the scan design protocol, which results in effective detection of a delay fault as well as effective detection of a stuck-at fault in the semiconductor integrated circuit.

According to an eleventh aspect of the present invention, there is provided a scan test control method for a scan test circuit comprising a first block having a first scan test circuit that operates in synchronization with first and second clocks, and a second block having a second scan test circuit that is synchronized with only the first clock, wherein the normal operation time of the scan test in the first block is different from the normal operation time of the scan test in the second block. Therefore, passing of desired data between the first block and the second block becomes possible, whereby the first block and the second block can be simultaneously subjected to scan test, and further, a stuck-at fault between the first block and the second block can also be detected.

According to a twelfth aspect of the present invention, there is provided a scan test circuit having a first block having a first scan test circuit that operates in synchronization with first and second clocks, and a second block having a second scan test circuit that is synchronized with only the first clock, and the scan test circuit comprises: a plurality of first storage elements synchronized with the first clock; a plurality of second storage elements synchronized with the first and second clocks; and a selection circuit for selecting either a first path between the plural first storage elements and the second block, or a second path between the plural second storage elements and the first block, as a path for passing data from the first block to the second block; wherein the first storage elements, second storage elements, and selection circuit are provided between the first block and the second block. Therefore, passing of desired data between the first block and the second block becomes possible, whereby the first block and the second block can be simultaneously subjected to scan test, and further, a stuck-at fault between the first block and the second block can also be detected.

According to a thirteenth aspect of the present invention, in the scan test circuit according to the twelfth aspect, the plurality of first storage elements and the plurality of second storage elements are a plurality of controllable scan storage elements for controlling a signal inputted to the second block, or a plurality of monitor storage elements for holding a signal outputted from the first block.

According to a fourteenth aspect of the present invention, in the scan test circuit according to the thirteenth aspect, the plurality of monitor storage elements are constituted by a single monitor storage element.

According to a fifteenth aspect of the present invention, in the scan test circuit according to the fourteenth aspect, the selection circuit is replaced with a circuit which separates the first path from the second path, when generating a scan test pattern. Therefore, between the first block and the second block, a scan test pattern can be generated for each of the first path between the storage elements which are synchronized with the first clock, and the second path between the storage elements which are synchronized with the scan clock generated by the scan clock generation means, and the scan test using the scan test control method or the scan test circuit according to any of the eleventh to fourteenth aspects can be carried out using the scan pattern thus generated.

PREFERRED EMBODIMENTS OF THE PRESENT INVENTION

Hereinafter, preferred embodiments of the present invention will be described with reference to the drawings.

(Embodiment 1)

Figure 1:
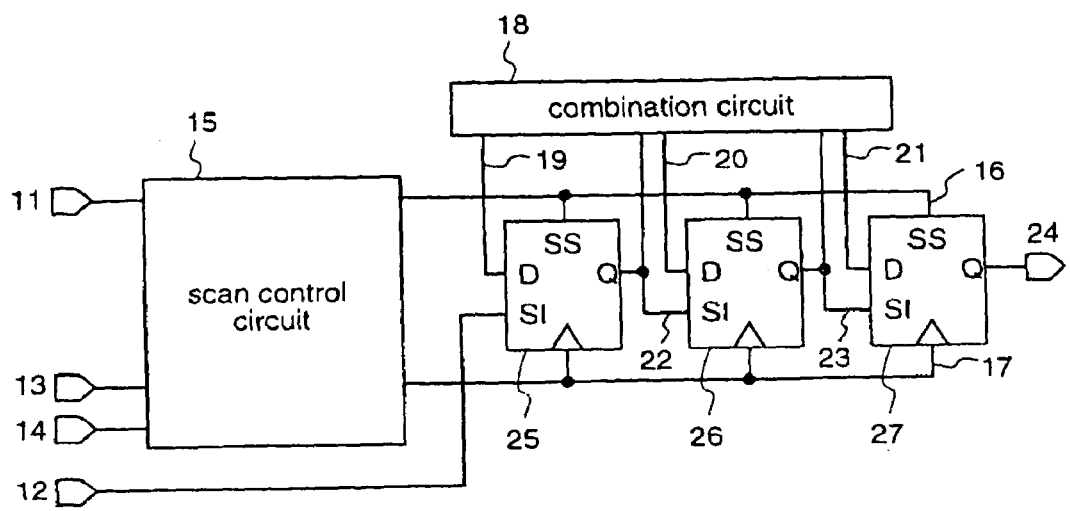
FIG. 1 is a block diagram illustrating a scan test circuit according to a first embodiment of the present invention.

FIG. 1 is a block diagram illustrating a scan test circuit according to a first embodiment of the present invention. In FIG. 1, the scan test circuit comprises external input terminals 11~14, a scan control circuit 15, a scan selection internal signal line 16, a scan clock signal line 17, a combination circuit 18, normal data lines 19~21, an external output terminal 24, and a scan chain having n (n>1) pieces of scan storage elements. The scan test circuit shown in FIG. 1 includes three (n=3) pieces of scan storage elements 25~27. Further, it includes an output data line 22 of the scan storage element 25, and an output data line 23 of the scan storage element 26.

The external input terminal 11 receives a scan selection external signal. The external input terminal 12 receives scan-in data. The external input terminal 13 receives a normal operation clock. The external input terminal 14 receives a test clock. The scan control circuit 15 receives the scan selection external signal from the external input terminal 11, the normal operation clock from the external input terminal 13, and the test clock from the external input terminal 14, and generates a scan selection internal signal for switching the operation mode of the scan storage elements between the normal operation mode and the scan mode, and a scan clock that is an operation clock for the scan storage elements. Then, the scan selection internal signal is output to the scan selection internal signal line 16, and the scan clock is output to the scan clock signal line 17. The scan storage elements 25 27 hold and output the data in synchronization with the rising edge of the scan clock that is generated by the scan control circuit 15. The external output terminal 24 outputs the output data of the scan storage element 27 to the outside. The combination circuit 18 receives the data from the output data lines 22 and 23, and outputs the data to the normal data lines 19~21. The scan test circuit shown in FIG. 1 tests the combination circuit 18.

Figure 2:
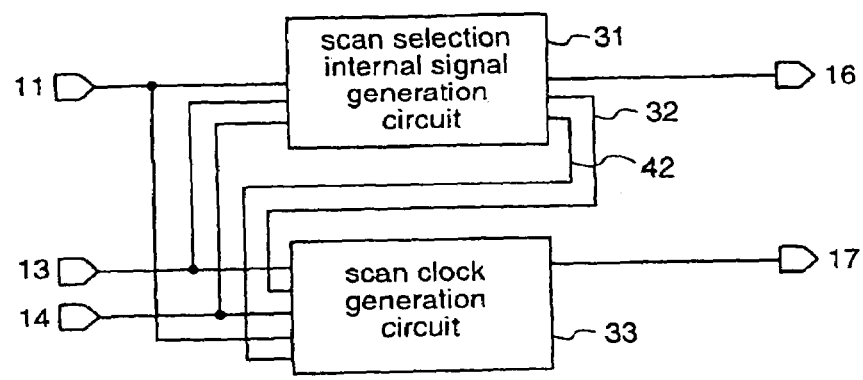
FIG. 2 is a block diagram illustrating a concrete example of a scan control circuit according to the first embodiment.

FIG. 2 is a block diagram illustrating a concrete example of the scan control circuit 15 shown in FIG. 1. The same reference numerals as those shown in FIG. 1 denote the same or corresponding parts. In FIG. 2, the scan control circuit 15 is provided with a scan selection internal signal generation circuit 31, a normal operation clock mask signal line 32, an output signal line 42, and a scan clock generation circuit 33.

The scan selection internal signal generation circuit 31 receives the scan selection external signal from the external input terminal 11, the normal operation clock from the external input terminal 13, and the test clock from the external input terminal 14, and generates a scan selection internal signal and a normal operation clock mask signal. Then, the scan selection internal signal generation circuit 31 outputs the scan selection internal signal to the scan selection internal signal line 16 and to the output signal line 42, and outputs the normal operation clock mask signal to the normal operation clock mask signal line 32. The scan clock generation circuit 33 receives the scan selection external signal from the external input terminal 11, the normal operation clock from the external input terminal 13, the test clock from the external input terminal 14, the normal operation clock mask signal from the normal operation clock mask signal line 32, and the scan internal selection signal from the output signal line 42, generates a scan clock as an operation clock for the scan storage elements 25 27, and outputs the scan clock to the scan clock signal line 17.

Figure 3:
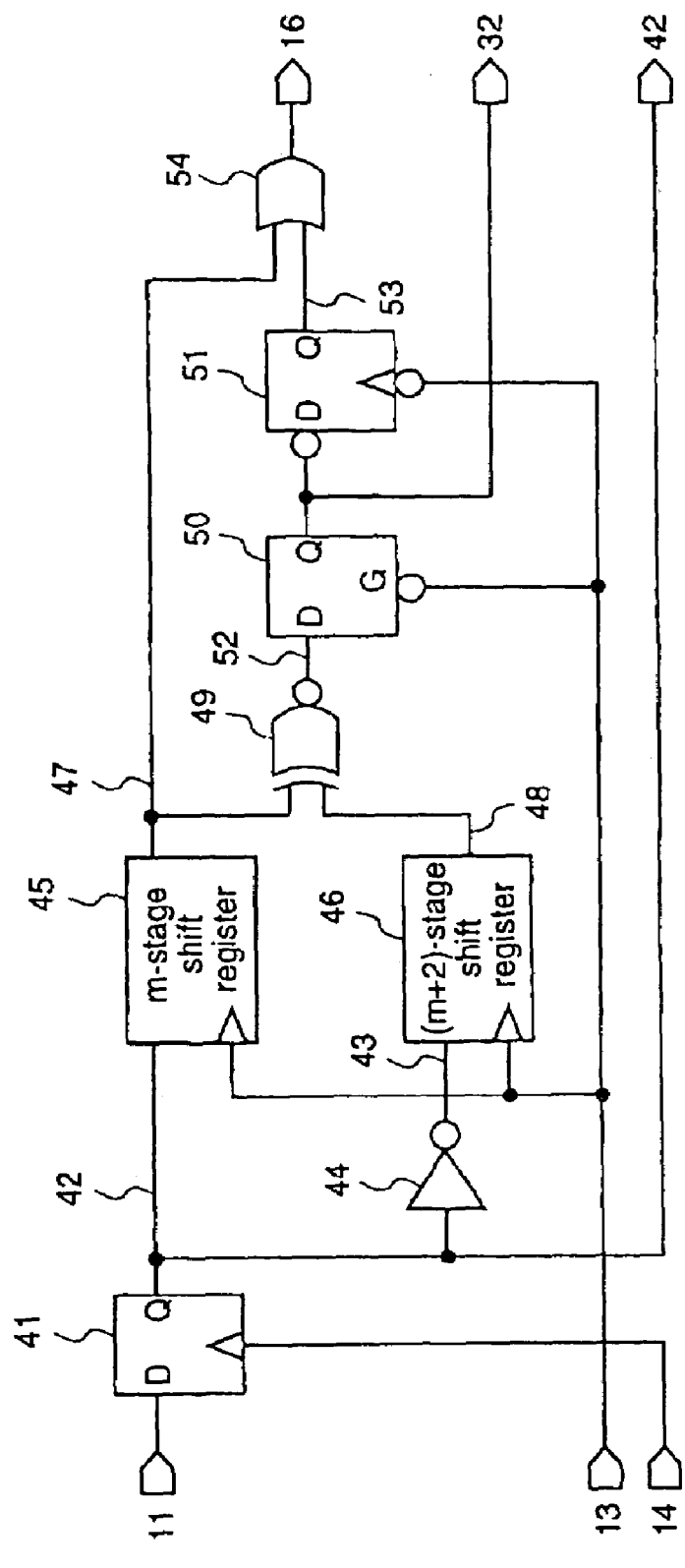
FIG. 3 is a block diagram illustrating a concrete example of a scan selection internal signal generation circuit according to the first embodiment.

FIG. 3 is a block diagram illustrating a concrete example of the scan selection internal signal generation circuit 31 shown in FIG. 2. The same reference numerals as those shown in FIG. 2 denote the same or corresponding parts. In FIG. 3, the scan selection internal signal generation circuit 31 comprises a storage element 41, an output signal line 42 of the storage element 41, an inverter circuit 44, an output signal line 43 of the inverter circuit 44, an m-stage shift register 45 (m>0), an (m+2)-stage shift register 46 (m>0), an output signal line 47 of the m-stage shift register 45, an output signal line 48 of the (m+2)-stage shift register 46, an EXNOR circuit 49, a latch circuit 50, an output signal line 52 of the EXNOR circuit 49, a normal operation mask signal line 32, a storage element 51, an output signal line 53 of the storage element 51, and an OR circuit 54.

The storage element 41 holds and outputs a scan selection external signal inputted to the external input terminal 11, in synchronization with the rising edge of the test clock received by the external input terminal 14. The m-stage shift register 45 holds the signal supplied from the output signal line 42, in synchronization with the rising edge of the normal operation clock inputted to the external input terminal 13. The EXNOR circuit 49 outputs a signal "1" when the signal from the output signal line 47 matches the signal from the output signal line 48, and outputs a signal "0" when these signals do not match. The latch circuit 50 outputs the signal supplied from the output signal line 52 as it is at the falling edge of the normal operation clock received by the external input terminal 13, and holds the signal supplied from the output signal line at the rising edge of the normal operation clock. The normal operation mask signal line 32 is a signal line for outputting the output signal of the latch circuit 50 as a normal operation mask signal. The storage element 51 holds a signal that is obtained by inverting the logic value of the signal from the normal operation mask signal line 32, in synchronization with the falling edge of the normal operation clock received by the external input terminal 13. The OR circuit 54 receives the signal from the output signal line 47 and the signal from the output signal line 53, and outputs them to the scan selection internal signal line 16.

Figure 4:
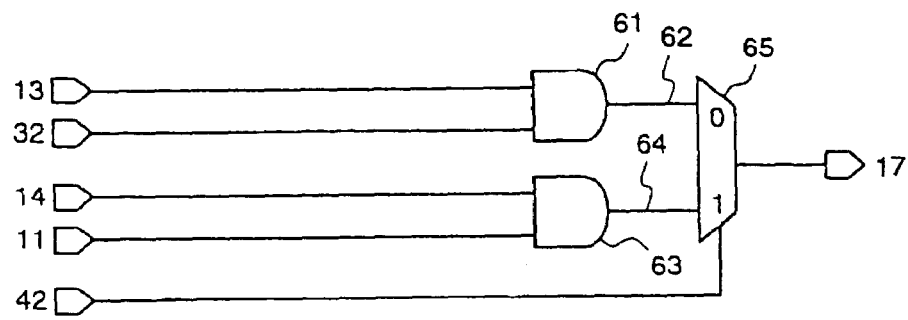
FIG. 4 is a block diagram illustrating a concrete example of a scan clock generation circuit according to the first embodiment.

FIG. 4 is a block diagram illustrating a concrete example of the scan clock generation circuit 33 shown in FIG. 2. In FIG. 4, the same reference numerals as those shown in FIGS. 2 and 3 denote the same parts. The scan clock generation circuit 33 is provided with AND circuits 61 and 63, an output signal line 62 of the AND circuit 61, an output signal line 64 of the AND circuit 63, and a selector circuit 65.

The AND circuit 61 receives the normal operation clock from the external input terminal 13, and the normal operation mask signal from the normal operation mask signal line 32, and outputs a normal operation clock. The AND circuit 63 receives the test clock from the external input terminal 14, and the scan selection external signal from the external input terminal 11, and outputs the test clock. The selector circuit 65 outputs, as a scan clock, the normal operation clock supplied from the output signal line 62, to the scan clock signal line 17, when the signal supplied from the output signal line 42 is "0", and outputs the test clock supplied from the output signal line 64, to the scan clock signal line 17, when the signal supplied from the output signal line 42 is "1".

Figure 5:
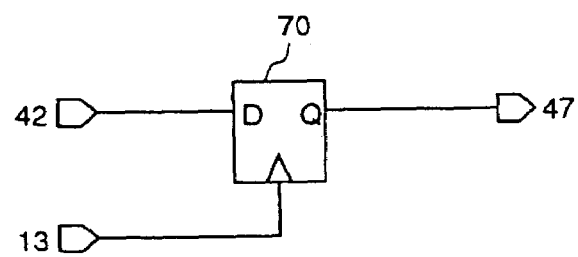
FIG. 5 is a block diagram illustrating a concrete example of an m-stage shift register (m=1) according to the first embodiment.

FIG. 5 is a block diagram illustrating a concrete example of the m-stage shift register shown in FIG. 3. In FIG. 5, the same reference numerals as those shown in FIG. 3 denote the same or corresponding parts. In FIG. 5, the m-stage shift register 45 is provided with a storage element 70 which holds the signal from the output signal line 42 and outputs it to the output signal line 47, in synchronization with the rising edge of the normal operation clock inputted to the external input terminal 13.

Figure 6:
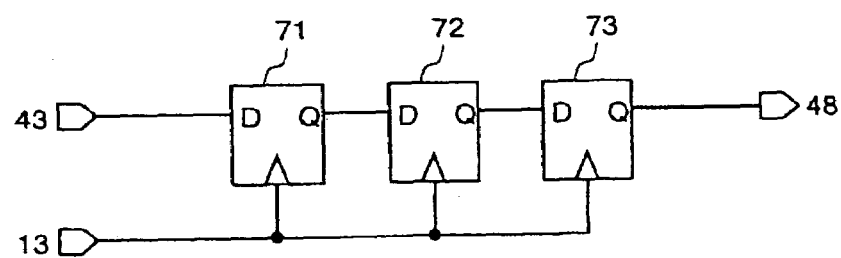
FIG. 6 is a block diagram illustrating a concrete example of an m+2-stage shift register (m=1) according to the first embodiment.

FIG. 6 is a block diagram illustrating a concrete example of the (m+2)-stage shift register shown in FIG. 3. The same reference numerals as those shown in FIG. 3 denote the same parts. In FIG. 6, the (m+2)-stage shift register 46 has storage elements 71~73. The storage element 71 holds and outputs the signal from the output signal line 43 in synchronization with the rising edge of the normal operation clock inputted to the external input terminal 13. The storage element 72 holds and outputs the output signal of the storage element 71 in synchronization with the rising edge of the normal operation clock. The storage element 73 holds the output signal of the storage element 72 and outputs it to the output signal line 48 in synchronization with the rising edge of the normal operation clock.

Figure 7:
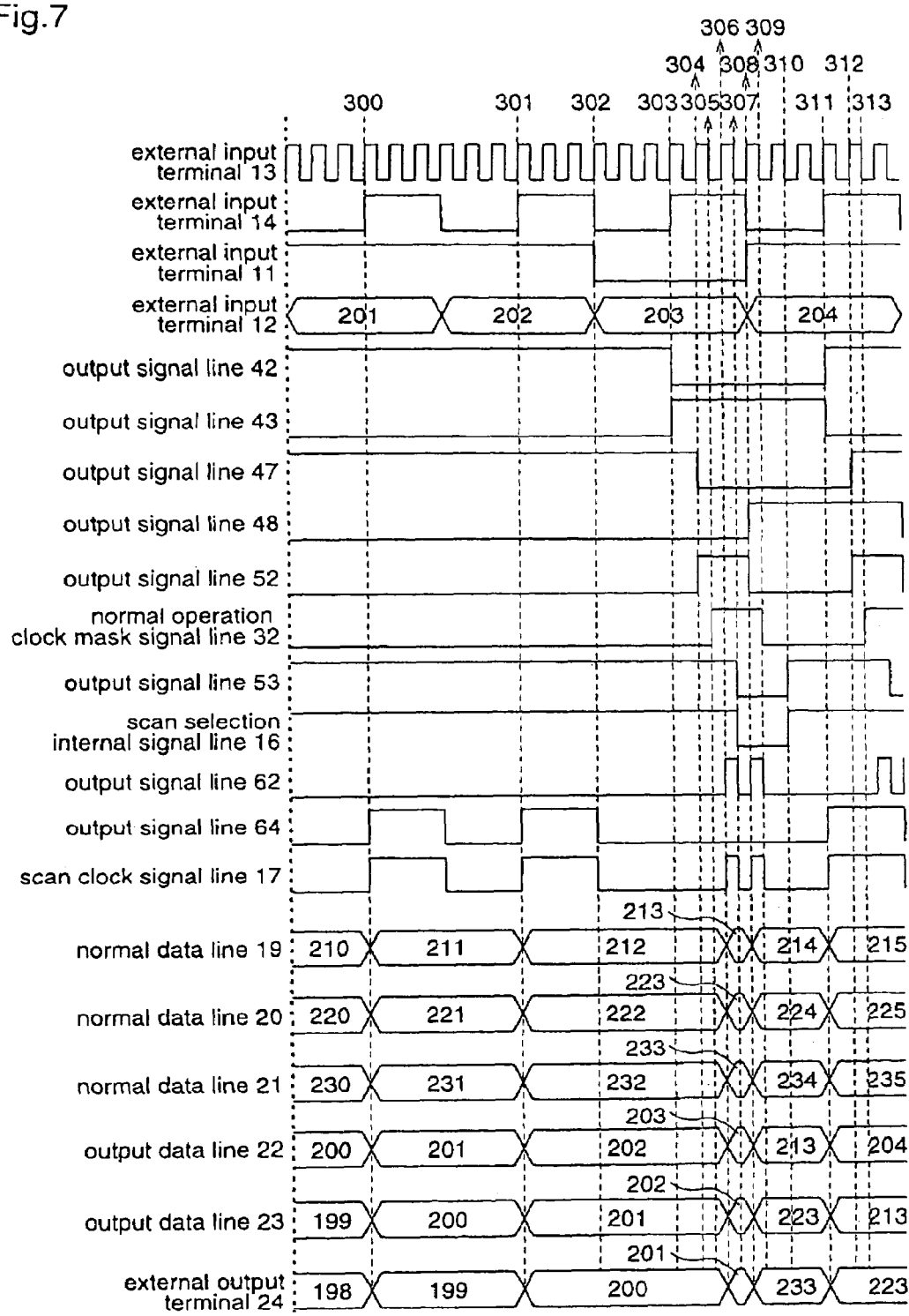
FIG. 7 is a timing chart illustrating the operation of the scan test circuit according to the first embodiment.

FIG. 7 is a time chart for explaining the operation of the scan test circuit constituted as described above. In FIG. 7, reference numerals 200~204 denote scan-in data inputted to the external input terminal 12, numerals 210~215 denote normal data on the normal data line 19, numerals 220~225 denote normal data on the normal data line 20, numerals 230~235 denote normal data on the normal data line 21, numeral 198 denotes initial data that is stored in the scan storage element 27 during the scan operation, and numeral 199 denotes initial data stored in the scan storage element 26 during the scan operation. Further, reference numerals 300~313 indicate event timings. Other reference numerals denote the waveforms of signals at the signal lines and external terminals corresponding to those shown in FIGS. 1 to 6.

Hereinafter, the operation of the scan test circuit will be described with reference to FIGS. 1~7. It is assumed that the normal operation clock inputted to the external input terminal 13 is six times as high as the test clock inputted to the external input terminal 14. Further, it is assumed that m is equal to 1, and "1" is stored in the storage elements 41, 51, and 70 while "0" is stored in the storage elements 71, 72, 73 and the latch circuit 50, as initial values.

When the signal from the scan selection internal signal line 16 is "0", the scan storage elements 25~27 are in the normal operation mode and perform the normal operation. That is, the scan storage elements 25~27 serve as normal storage elements. To be specific, in synchronization with the rising edge of the scan clock inputted to the scan clock signal line 17, the scan storage element 25 holds and outputs the normal data supplied from the normal data line 19, the scan storage element 26 holds and outputs the normal data supplied from the normal data line 20, and the scan storage element 27 holds and outputs the normal data supplied from the normal data line 21.

When the signal from the scan selection internal signal line 16 is "1", the scan storage elements 25~27 are in the scan mode and perform the scan operation. That is, the scan storage elements 25~27 serve as storage elements. To be specific, in synchronization with the rising edge of the scan clock inputted to the scan clock signal line 17, the scan storage element 25 holds and outputs the scan-in data supplied from the external input terminal 12, the scan storage element 26 holds and outputs the output data of the scan storage element 25, and the scan storage element 27 holds and outputs the output data of the scan storage element 26.

At the event timing 300, the storage element 41 holds the scan selection external signal "1" and outputs it to the output signal line 42 in synchronization with the rising edge of the test clock. However, the initial values stored in the storage element 41 are not changed. At this time, the selector circuit 65 selects the output signal line 64 because the signal from the output signal line 42 is "1", and the AND circuit 63 outputs the test clock to the output signal line 64 because the scan selection external signal remains "1". Accordingly, the signal outputted from the scan clock signal line 17 becomes a test clock.

Further, the initial values stored in the storage element 51, the storage elements 70~73, and the latch circuit 50 are not changed like those stored in the storage element 41. Accordingly, the scan selection internal signal from the scan selection signal line 16 remains "1", whereby the scan storage elements 25~27 go into the scan mode. In synchronization with the rising of the test clock, the scan storage element 25 holds and outputs the scan-in data 201 supplied from the external input terminal 12, the scan storage element 26 holds and outputs the output data 200 of the scan storage element 25, and the scan storage element 27 holds and outputs the output data 199 of the scan storage element 26. The external output terminal 24 outputs the output data 199 of the scan storage element 27. That is, the scan operation at the event timing 300 is scan-in and scan-out using the test clock.

Since, at the event timing 301, the scan selection external signal remains "1" as at the event timing 300, the signal from the scan clock signal line 17 becomes a test clock. Further, since the scan selection signal line 16 remains "1", the scan storage elements 25~27 go into the scan mode. In synchronization with the rising of the test clock, the scan storage element 25 holds and outputs the scan-in data 202 supplied from the external input terminal 12, the scan storage element 26 holds and outputs the output data 201 of the scan storage element 25, and the scan storage element 27 holds and outputs the output data 200 of the scan storage element 26. The external output terminal 24 outputs the output data 200 of the scan storage element 27. That is, the scan operation at the event timing 301 is scan-in and scan-out using the test clock.

At the event timing 302, the scan selection external signal transits to "0". Therefore, the AND circuit 63 outputs the signal "0" to the output signal line 64, and maintains the scan clock at "0", which is output from the scan clock signal line 17 through the selector circuit 65.

At the event timing 303, the storage element 41 holds the scan selection external signal "0" and outputs it to the output signal line 42 in synchronization with the rising of the test clock. Further, the inverter circuit 44 receives the output signal "0" supplied from the storage element 41, and outputs the signal "1" to the output signal line 43. The selector circuit 65 selects the output signal line 62 because the signal supplied from the output signal line 42 is "0", and outputs the normal operation clock to the scan clock signal line 17. At this time, because the signal supplied from the normal operation clock mask signal line 32 is "0", the AND circuit 61 masks the normal operation clock. Thereby, the signal from the output signal line 62 becomes "0". Accordingly, the scan clock from the scan clock signal line 17 remains "0".

At the event timing 304, the storage element 70 in the m-stage shift register 45 holds and outputs the output signal "0" of the storage element 41 in synchronization with the rising edge of the normal operation clock. Further, in synchronization with the rising of the normal operation clock, the storage element 71 in the (m+2)-stage shift register 46 holds and outputs the signal "1" supplied from the output signal line 43, the storage element 72 holds and outputs the output signal "0" of the storage element 71, and the storage element 73 holds and outputs the output signal "0" of the storage element 72. Then, the EXNOR circuit 49 receives the signal "0" from the output signal line 47 and the signal "0" from the output signal line 48, and outputs the signal "1" to the output signal line 52.

At the event timing 305, the storage element 51 holds and outputs the inverted value "1" of the output signal "0" supplied from the latch circuit 50, in synchronization with the falling edge of the normal operation clock. At this time, because the signal supplied from the output signal line 47 is "0", the OR circuit 54 outputs the output signal "1" of the storage element 51 to the scan selection internal signal line 16. However, the value of the scan selection internal signal supplied from the scan selection internal signal line 16 is not changed. On the other hand, the latch circuit 50 outputs the signal "1" supplied from the output signal line 52 to the normal operation clock mask signal line 32 at the falling edge of the normal operation clock. Thereby, the AND circuit 61 outputs the normal operation clock to the output signal line 62, and the selector circuit 65 outputs the signal supplied from the output signal line 62, to the scan clock signal line 17. Thereby, the scan clock supplied from the scan clock signal line 17 becomes the normal operation clock.

At the event timing 306, the storage element 70 in the m-stage shift register 45 holds the output signal "0" of the storage element 41 and outputs it to the output signal line 47 in synchronization with the rising edge of the normal operation clock, but the stored value is not changed. Further, the storage element 71 in the (m+2)-stage shift register 46 holds and outputs the signal "1" supplied from the output signal line 43, the storage element 72 holds and outputs the output signal "1" of the storage element 71, and the storage element 73 holds and outputs the output signal "0" of the storage element 72, in synchronization with the rising edge of the normal operation clock. Then the EXNOR circuit 49 receives the signal "0" supplied from the output signal line 47 and the signal "0" supplied from the output signal line 48, and outputs the signal "1" to the output signal line 52, but the stored value is not changed. On the other hand, since the signal on the scan selection internal signal line 16 is maintained at "1", the scan storage element 25 holds and outputs the scan-in data 203 supplied the external input terminal 12, the scan storage element 26 holds and outputs the output data 202 of the scan storage element 25, and the scan storage element 27 holds and outputs the output data 201 of the scan storage element 26, in synchronization with the rising of the normal operation clock inputted through the scan clock signal line 17. The external output terminal 24 outputs the output data 201 of the scan storage element 27. That is, the final scan operation at the event timing 306 is scan-in and scan-out using the normal operation clock.

At the even timing 307, the storage element 51 holds and outputs the inverted value "0" of the output signal "1" supplied from the latch circuit 50, in synchronization with the falling edge of the normal operation clock. At this time, since the signal on the output signal line 47 is "0", the OR circuit 54 outputs the output signal "0" of the storage element 51 to the scan selection internal signal line 16. That is, the scan internal selection signal becomes "0". Therefore, the scan storage elements 25~27 are changed from the scan mode to the normal operation mode.

At the event timing 308, the scan selection external signal transits to "1". Therefore, the AND circuit 63 outputs the test clock to the output signal line 64, but the test clock does not adversely affect the scan clock outputted from the scan clock signal line 17 because the selector circuit 65 selects the output signal line 62. On the other hand, the storage element 70 in the m-stage shift register 45 holds and outputs the output signal "0" of the storage element 41 in synchronization with the rising edge of the normal operation clock. Further, in synchronization with the rising edge of the normal operation clock, the storage element 71 in the (m+2)-stage shifter register 46 holds and outputs the signal "1" supplied from the output signal line 43, the storage element 72 holds and outputs the output signal "1" of the storage element 71, and the storage element 73 holds and outputs the output signal "1" of the storage element 72. Then, the EXNOR circuit 49 receives the signal "0" supplied from the output signal line 47 and the signal "1" supplied from the output signal line 48, and outputs the signal "0" to the output signal line 52. As for the scan storage elements 25~27 which are switched to the normal operation mode, the scan storage element 25 holds and outputs the normal data 213 supplied from the normal data line 19, the scan storage element 26 holds and outputs the normal data 223 supplied from the normal data line 20, and the scan storage element 27 holds and outputs the normal data 233 supplied from the normal data line 21, in synchronization with the rising edge of the normal operation clock. The external output terminal 24 outputs the output data 233 of the scan storage element 27. That is, the normal operation at the event timing 308 is carried out using the normal operation clock.

At the event timing 309, the storage element 51 holds and outputs the inverted value "0" of the output signal "1" supplied from the latch circuit 50, in synchronization with the falling edge of the normal operation clock. At this time, since the signal supplied from the output signal line 47 is "0", the OR circuit 54 outputs the output signal "0" of the storage element 51 to the scan selection internal signal line 16. However, the value of the signal supplied from the scan selection internal signal line 16 is not changed. On the other hand, the latch circuit 50 outputs the signal "0" supplied from the output signal line 52, to the normal operation clock mask signal line 32, at the falling edge of the normal operation clock. The AND circuit 61 outputs the signal "0" to the output signal line 62, and masks the normal operation clock.

At the event timing 310, the storage element 51 holds and outputs the inverted value "1" of the output signal "0" supplied from the latch circuit 50, in synchronization with the falling edge of the normal operation clock. Since the signal supplied from the output signal line 47 at this time is "0", the OR circuit 54 outputs the output signal "1" of the storage element 51 to the scan selection internal signal line 16. Therefore, the scan storage elements 25~27 are changed from the normal operation mode to the scan mode. On the other hand, the latch circuit 50 outputs the signal "0" supplied from the output signal line 52, to the normal operation clock mask signal line 32 at the falling edge of the normal operation clock. However, the value of the signal supplied from the normal operation clock mask signal line 32 is not changed.

At the event timing 311, the storage element 41 holds the scan selection external signal "1" and outputs it to the output signal line 42 in synchronization with the rising edge of the test clock. Further, the inverter circuit 44 receives the output signal "1" from the storage element 41, and outputs the signal "0" to the output signal line 43. The selector circuit 65 selects the signal supplied from the output signal line 64 and outputs it to the scan clock signal line 17 because the signal supplied from the output signal line 42 is "1". At this time, the AND circuit 63 outputs the test clock to the output signal line 64 because the scan selection external signal is "1". Accordingly, the scan clock supplied from the scan clock signal line 17 becomes a test clock. In synchronization with the rising edge of the test clock, the scan storage element 25 holds and outputs the scan-in data 204 supplied from the external input terminal 12, the scan storage element 26 holds and outputs the output data 213 of the scan storage element 25, and the scan storage element 27 holds and outputs the output data 223 of the scan storage element 26. The external output terminal 24 outputs the output data 223 of the scan storage element 27. That is, the scan operation at the event timing 311 is scan-in and scan-out using the test clock.

At the event timing 312, the storage element 70 in the m-stage shift register 45 holds the output signal "1" of the storage element 41 and outputs it to the output signal line 42 in synchronization with the rising edge of the normal operation clock. Further, the storage element 71 in the (m+2)-stage shift register 46 holds and outputs the signal "0" supplied from the output signal line 43, the storage element 72 holds and outputs the output signal "1" of the storage element 71, and the storage element 73 holds and outputs the output signal "1" of the storage element 72. Then, the EXNOR circuit 49 receives the signal "1" from the output signal line 47 and the signal "1" from the output signal line 48, and outputs the signal "1" to the output signal line 52.

At the event timing 313, the storage element 51 holds and outputs the inverted value "1" of the output signal "1" from the latch circuit 50 in synchronization with the falling edge of the normal operation clock. At this time, because the signal from the output signal line 47 is "1", the OR circuit 54 outputs the output signal "1" of the storage element 51 to the scan selection internal signal line 16. As a result, the value of the signal from the scan selection internal signal line 16 is not changed, and the scan storage elements 25 27 remain in the scan mode. On the other hand, the latch circuit 50 outputs the signal "1" supplied from the output signal line 52, to the normal operation clock mask signal line 32 at the falling edge of the normal operation clock. Accordingly, the AND circuit 61 outputs the normal operation clock to the output signal line 62. However, the selector circuit 65 selects the signal from the output signal line 64 and outputs it to the scan clock signal line 17 because the signal from the output signal line 42 is maintained at "1". Accordingly, the scan clock outputted from the scan clock signal line 17 remains as a test clock.

Figure 8:
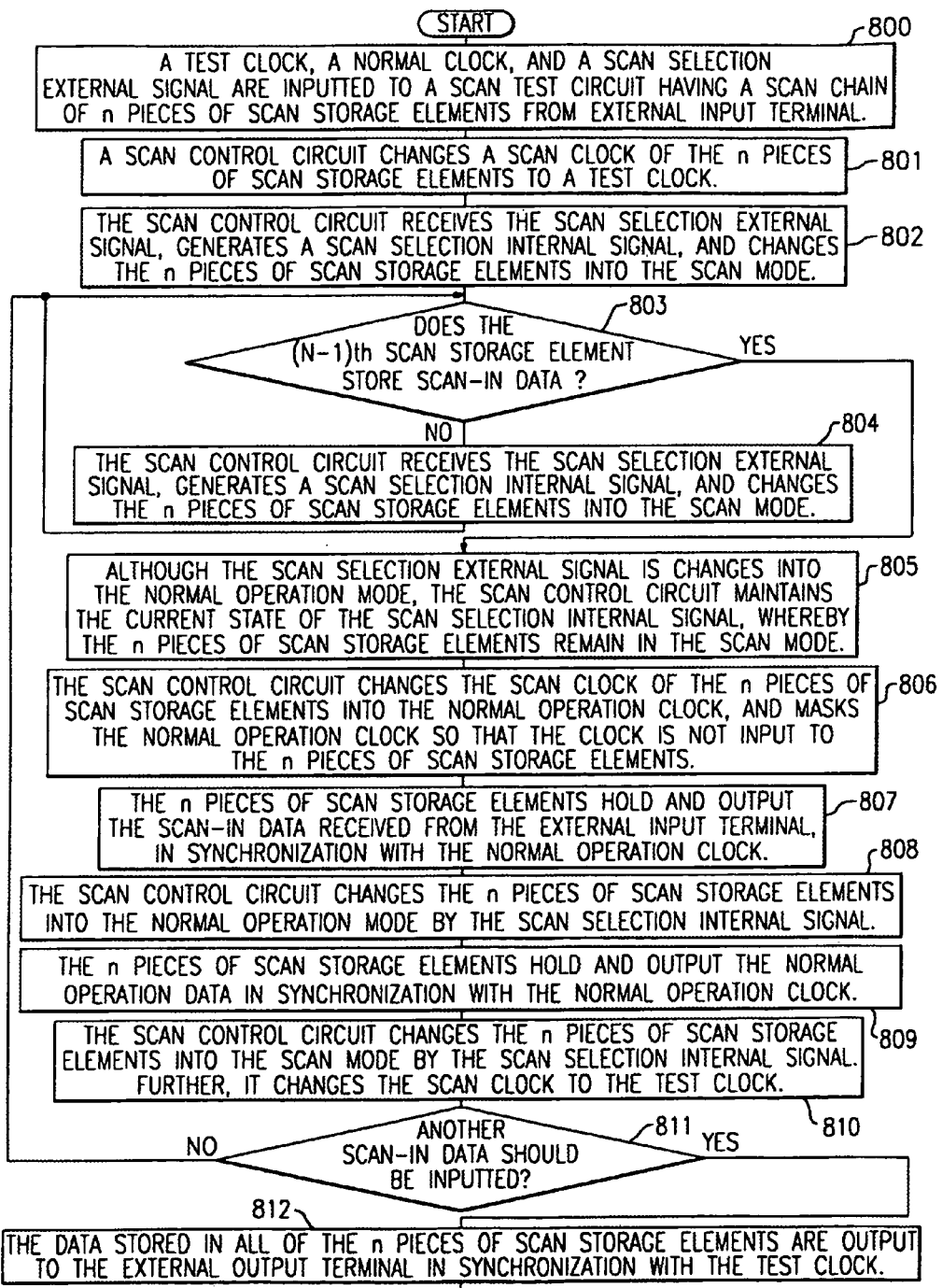
FIG. 8 is a flowchart for explaining a scan test control method according to the first embodiment.

With respect to the operation described above, the outline of the processing for generating a test line using the first embodiment of the invention will be described with reference to a flowchart shown in FIG. 8.

(1) Processing at Steps 800~802.

Initially, in the scan test circuit according to the first embodiment, the external input terminal 14 receives the test clock, the external input terminal 13 receives the normal operation clock, and the external input terminal 11 receives the scan selection external signal. The scan control circuit 15 switches the scan clock from the scan clock signal line 17 to the test clock, and generates the scan selection internal signal of the scan selection internal signal line 16 from the scan selection external signal, thereby setting the n (n=3) pieces of scan storage elements 25~27 in the scan mode.

(2) Processing at Step 803

It is judged whether the scan-in data is stored in the (n−1)th scan storage element 26 or not. In FIG. 7, at the event timing 300, the result of judgement is "NO" because the scan-in data 201 has not yet been stored in the scan storage element 26, and the processing goes to step 804.

(3) Processing at Step 804

The scan storage elements 25 and 26 hold and output the scan-in data inputted to the external input terminal 12, in synchronization with the rising edge of the test clock.

(4) Processing at Step 803

It is judged whether the scan-in data is stored in the (n−1)th scan storage element 26 or not. In FIG. 7, at the event timing 301, the result of judgement is "YES" because the scan-in data 201 is stored in the scan storage element 26, and the processing goes to step 805.

(5) Processing at Step 805

In FIG. 7, at the event timing 302, the scan selection external signal is switched to the normal operation mode. However, the scan control circuit 15 maintains the scan selection internal signal from the scan selection internal signal line 16 in the current scan mode. Accordingly, the n (n=3) pieces of scan storage elements 25~27 remain in the scan mode.

(6) Processing at Step 806

In FIG. 7, at the event timing 303, the scan control circuit 15 changes the scan clock supplied from the scan clock signal line 17 to the normal operation clock. However, the scan control circuit 15 masks the normal operation clock to prevent the clock from entering into the n pieces of scan storage elements 25~27.

(7) Processing at Step 807

The scan control circuit 15 unmasks the normal operation clock, and the n pieces of scan storage elements 25~27 hold and output the scan-in data supplied from the external input terminal 12 in synchronization with the normal operation clock, at the event timing 307, as shown in FIG. 7.

(8) Processing at Step 808

In FIG. 7, at the event timing 307, the scan control circuit 15 switches the scan selection internal signal from the scan selection internal signal line 16 to the normal operation mode.

(9) Processing at Step 809

In FIG. 7, at the event timing 308, the n (n=3) pieces of scan storage elements 25~27 hold and output the normal data in synchronization with the normal operation clock. At this time, the scan selection external signal is switched to the scan mode, but the scan control circuit 15 maintains the scan selection internal signal from the scan selection internal signal line 16 in the normal operation mode.

(10) Processing at Step 810

In FIG. 7, at the event timing 310, the scan control circuit 15 switches the scan selection internal signal from the scan selection internal signal line 16 to the scan mode. Further, at the event timing 311, the scan control circuit 15 switches the scan clock from the scan clock signal line 17 to the test clock.

(11) Processing at Step 811

In this step, it is judged whether the processing is ended or not. When the scan-in data to be tested still remain, the judgement is "NO", and the processing goes to step 803 to repeat the above-described processing. When there remain no scan-in data to be tested, the judgement is "YES", and the processing goes to step 812.

(12) Processing at Step 812

All of the normal data stored in the n (n=3) pieces of scan storage elements 25~27 in step 809 are output to the external output terminal 24 in synchronization with the test clock, thereby ending the processing.

As described above, the scan test circuit according to the first embodiment of the present invention is provided with the scan chain including n pieces of scan storage elements (n: integer, n>1), and the frequency of the first clock for shifting data into the first to (n−1)th scan storage elements and the frequency of the second clock for shifting data into the n-th scan storage element and performing the normal operation are independently controlled, whereby compatibility between the stable scan operation of inputting the shift-in data into the scan storage elements and the normal operation is realized, which results in effective detection of a delay fault as well as effective detection of a stuck-at fault.

[Embodiment 2]

Figure 20:
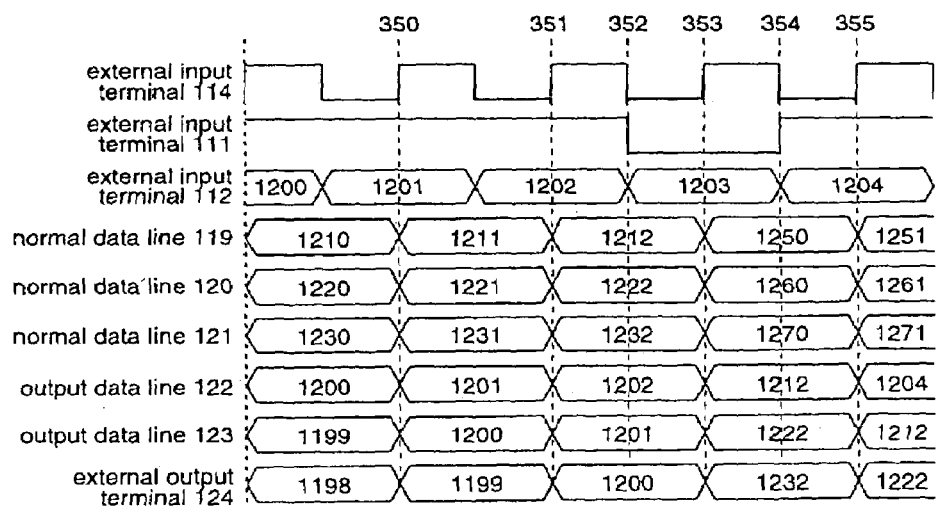
FIG. 20 is a timing chart illustrating the operation of the conventional scan test circuit.

In the scan test described for the first embodiment, the number of scan operations is increased by one time as compared with the conventional scan test. This is evident from comparison between the timing chart (FIG. 20) of the conventional scan test and the timing chart (FIG. 7) of the scan test according to the first embodiment. In the conventional scan test, as shown in FIG. 20, the scan storage elements 125~127 perform the last scan operation at the event timing 351, and the scan storage elements 125~127 perform the normal operation at the event timing 353 after the scan selection external signal at the external input terminal 111 is changed to "0". However, in the scan test according to the first embodiment, as shown in FIG. 7, the scan storage elements 25~27 perform the last but one scan operation, i.e., the (n−1)th scan operation, at the event timing 301, and the scan storage elements 25~27 do not yet perform the last scan operation, i.e., the n-th scan operation, at the event timing 353 after the scan selection external signal at the external input terminal 11 is changed to "0". The scan storage elements 25~27 perform the last scan operation at the event timing 306. That is, when the shift-in data which is used in the conventional scan test is applied as it is to the scan test of the first embodiment, the number of scan operations increases by one. Thereby, the data stored in the scan storage elements 25~27 during the normal operation are undesirably different from the data which are stored in the scan storage elements 125~127 in the conventional scan test. So, in this second embodiment, a desired circuit is added to the scan chain comprising the scan storage elements 25~27 so that the data stored in the scan storage elements 25~27 during the normal operation become the same as the data stored in the scan storage elements 125~127 in the conventional scan test.

Figure 10:
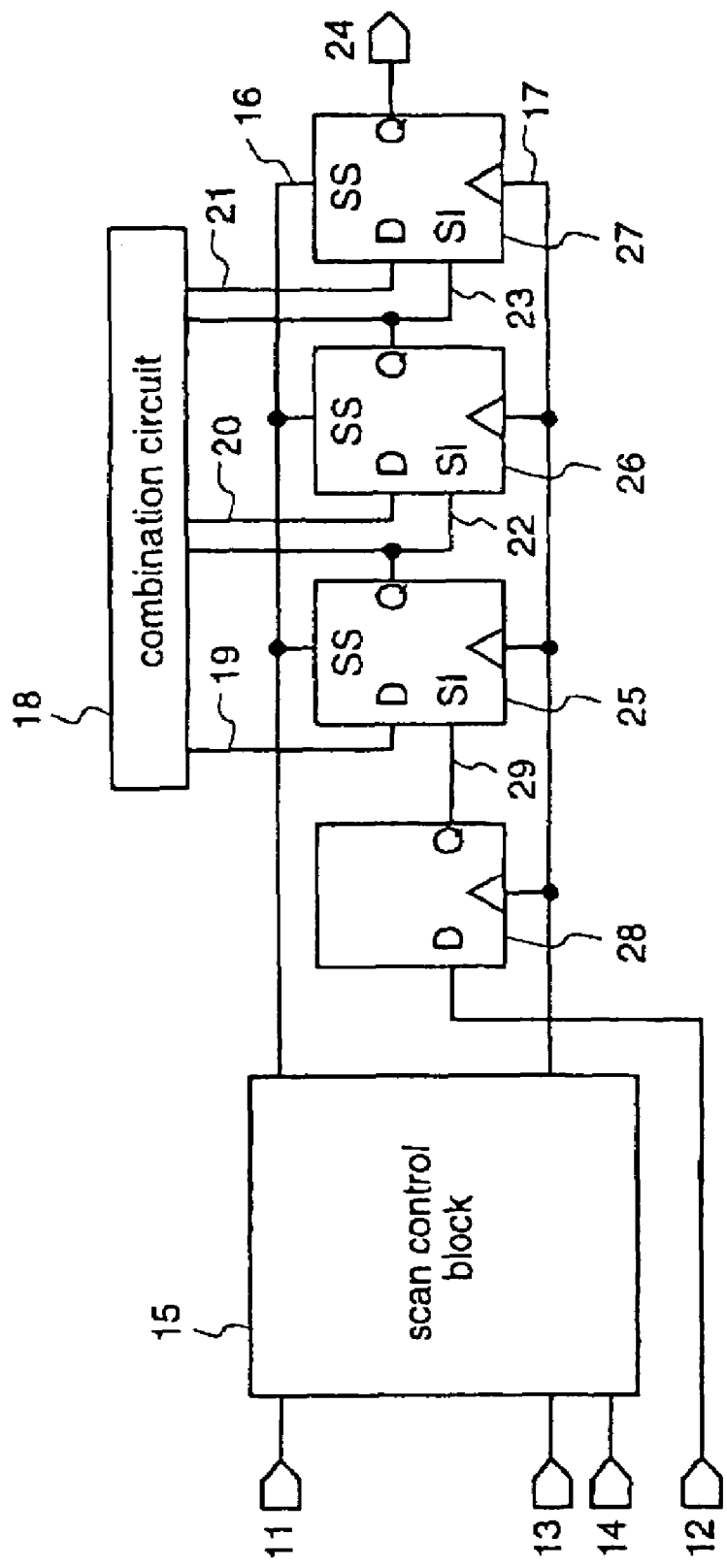
FIG. 10 is a block diagram of a scan test circuit according to a second embodiment of the present invention.

FIG. 10 is a block diagram illustrating a scan test circuit according to the second embodiment. In FIG. 10, the same reference numerals as those shown in FIG. 1 denote the same parts. In FIG. 10, the scan test circuit according to the second embodiment further includes a storage element 28, and an output signal line 29 of the storage element 28. Other constituents are identical to those of the scan test circuit according to the first embodiment.

Figure 11:
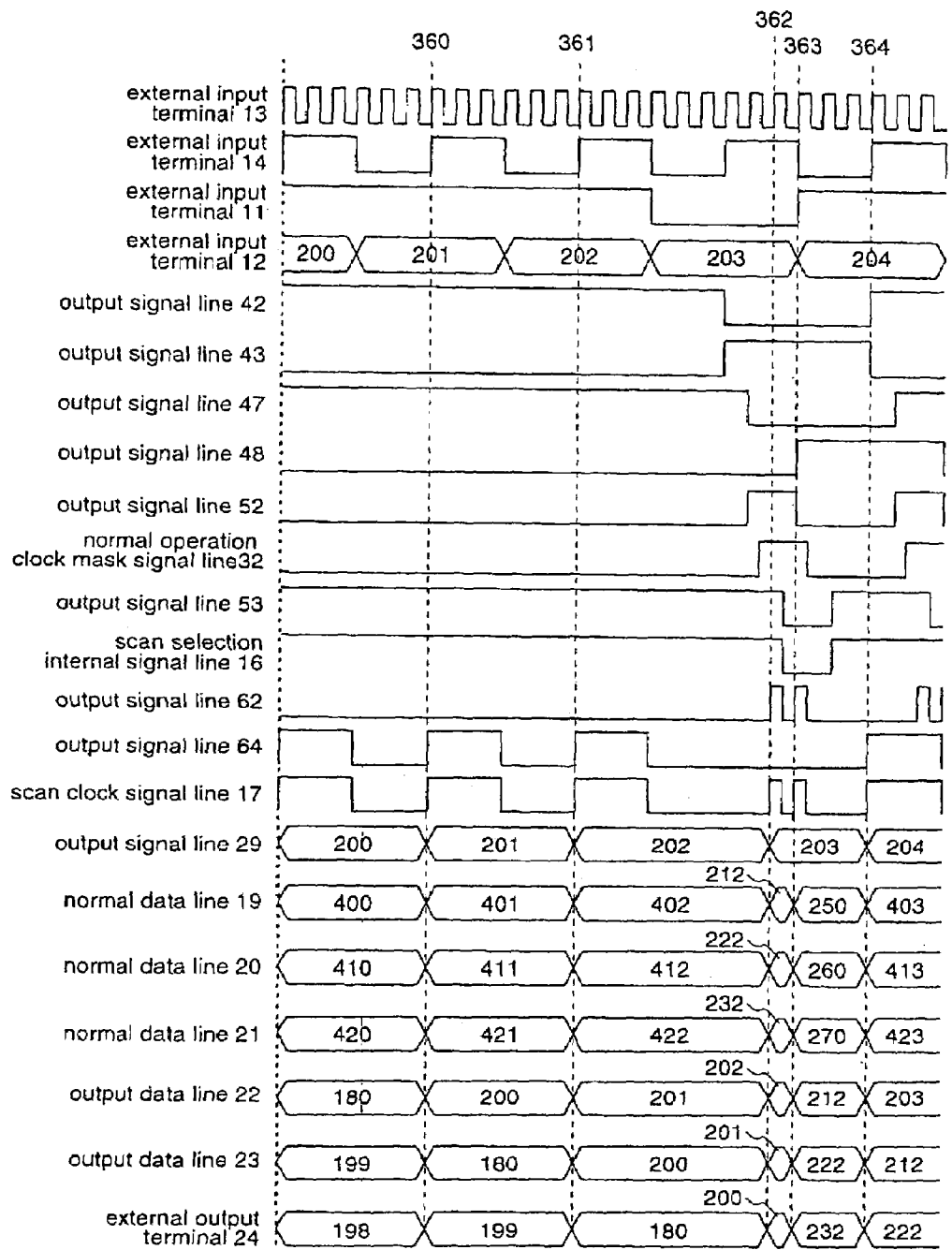
FIG. 11 is a timing chart illustrating the operation of the scan test circuit according to the second embodiment.

FIG. 11 is a time chart for explaining the operation of the scan test circuit constructed as described above. In FIG. 11, the same reference numerals as those shown in FIG. 7 denote the same parts. Reference numerals 400~403 denote normal data on the normal data line 19, numerals 410~413 denote normal data on the normal data line 20, numerals 420~423 denote normal data on the normal data line 21, and numeral 180 denotes initial data that is stored in the scan storage element 25 during the scan operation. Further, reference numerals 360~364 denote event timings. Other reference numerals denote the waveforms of signals at the signal lines and external terminals corresponding to the reference numerals shown in FIGS. 1~6 and 10.

Hereinafter, the operation of the scan test circuit will be described with respect to only the data stored in the storage element 28 and the scan storage elements 25~27, with reference to FIGS. 10 and 11. Since the operations of other elements are identical to those described for the first embodiment, repeated description is not necessary.

At the event timing 360, the storage element 28 holds and outputs the scan-in data 201 inputted to the external input terminal 12, in synchronization with the rising edge of the test clock. Since the scan storage elements 25~27 are in the scan mode at this timing, the scan storage element 25 holds and outputs the output data 200 of the storage element 28 in synchronization with the rising edge of the test clock. The scan storage element 26 holds and outputs the output data 200 of the storage element 25 in synchronization with the rising edge of the test clock. The scan storage element 27 holds and outputs the output data 199 of the scan storage element 26 in synchronization with the rising edge of the test clock. The external output terminal 24 outputs the output data 199 of the scan storage element 27.

At the event timing 361, the storage element 28 holds and outputs the scan-in data 202 supplied from the external input terminal 12, in synchronization with the rising edge of the test clock. Since the scan storage elements 25~27 are in the scan mode at this timing, the scan storage element 25 holds and outputs the output data 201 of the storage element 28 in synchronization with the rising edge of the test clock. The scan storage element 26 holds and outputs the output data 200 of the storage element 25 in synchronization with the rising edge of the test clock. The scan storage element 27 holds and outputs the output data 180 of the scan storage element 26 in synchronization with the rising edge of the test clock. The external output terminal 24 outputs the output data 180 of the scan storage element 27.

At the event timing 362, the storage element 28 holds and outputs the scan-in data 203 in synchronization with the rising edge of the normal operation clock. Since the scan storage elements 25~27 are in the scan mode at this timing, the scan storage element 25 holds and outputs the output data 202 of the storage element 28 in synchronization with the rising edge of the normal operation clock. The scan storage element 26 holds and outputs the output data 201 of the scan storage element 25 in synchronization with the normal operation clock. The scan storage element 27 holds and outputs the output data 200 of the scan storage element 26 in synchronization with the rising edge of the normal operation clock. The external output terminal 24 outputs the output data 200 of the scan storage element 27. At this time, since the scan storage elements 25~27 hold the same data as those held at the event timing 351 in the conventional scan test shown in FIG. 20, the normal data on the normal data lines 19~21 become equal to those at the event timing 351. To be specific, the normal data on the normal data line 19 is data 212, the normal data on the normal data line 20 is data 222, and the normal data on the normal data line 21 is data 232.

At the event timing 363, the storage element 28 holds and outputs the scan-in data 203 in synchronization with the rising edge of the normal operation clock. Since the scan storage elements 25~27 are in the normal operation mode at this timing, the scan storage element 25 holds and outputs the normal data 212 supplied from the normal data line 19 in synchronization with the rising edge of the normal operation clock. The scan storage element 26 holds and outputs the normal data 222 supplied from the normal data line 20 in synchronization with the rising edge of the normal operation clock. The scan storage element 27 holds and outputs the normal data 232 supplied from the normal data line 21 in synchronization with the rising edge of the normal operation clock. The external output terminal 24 outputs the output data 232 of the scan storage element 27.

At the event timing 364, the storage element 28 holds and outputs the scan-in data 204 inputted to the external input terminal 12, in synchronization with the rising edge of the test clock inputted to the external input terminal 14. Since the scan storage elements 25~27 are in the scan mode at this timing, the scan storage element 25 holds and outputs the output data 203 of the storage element 28 in synchronization with the rising edge of the test clock. The scan storage element 26 holds and outputs the output data 212 of the scan storage element 25 in synchronization with the rising edge of the test clock. The scan storage element 27 holds and outputs the output data 222 of the scan storage element 26 in synchronization with the rising edge of the test clock. The external output terminal 24 outputs the output data 222 of the scan storage element 27.

According to the scan test circuit and the scan test control method according to the second embodiment of the present invention, the effects described below are obtained in addition to the effects of the first embodiment. That is, since additional the storage element is provided in front of the scan chain having the n pieces of scan storage elements, the data stored in the scan storage elements during the normal operation are equal to those in the conventional scan test, and the shift-in data used in the conventional scan test can be subjected to scan test as they are. Further, the detection rate of stuck-at fault in the semiconductor integrated circuit can be the same as that in the conventional scan test.

[Embodiment 3]

In the scan test circuit according to the second embodiment, since the data stored in the scan storage elements during the normal operation are the same as those in the conventional scan test, it is possible to scan-test the shift-in data in the conventional scan test as they are. However, when generating a scan test pattern, if there is a scan design protocol that the scan selection external signal supplied from the outside of the semiconductor integrated circuit must be the same as the scan selection internal signal, and the scan-in data supplied from the outside of the semiconductor integrated circuit and the scan-in data inputted to the scan storage elements must be synchronized with each other by a single clock, the scan test circuit according to the second embodiment is against the scan design protocol. So, in the scan test circuit according to the third embodiment, the scan control circuit 15 and the storage element 28 are replaced with other circuits when generating a scan test pattern so that the circuit construction becomes the same as that of the conventional scan test circuit, thereby preventing the scan test circuit from infringing the scan design protocol.

Figure 12:
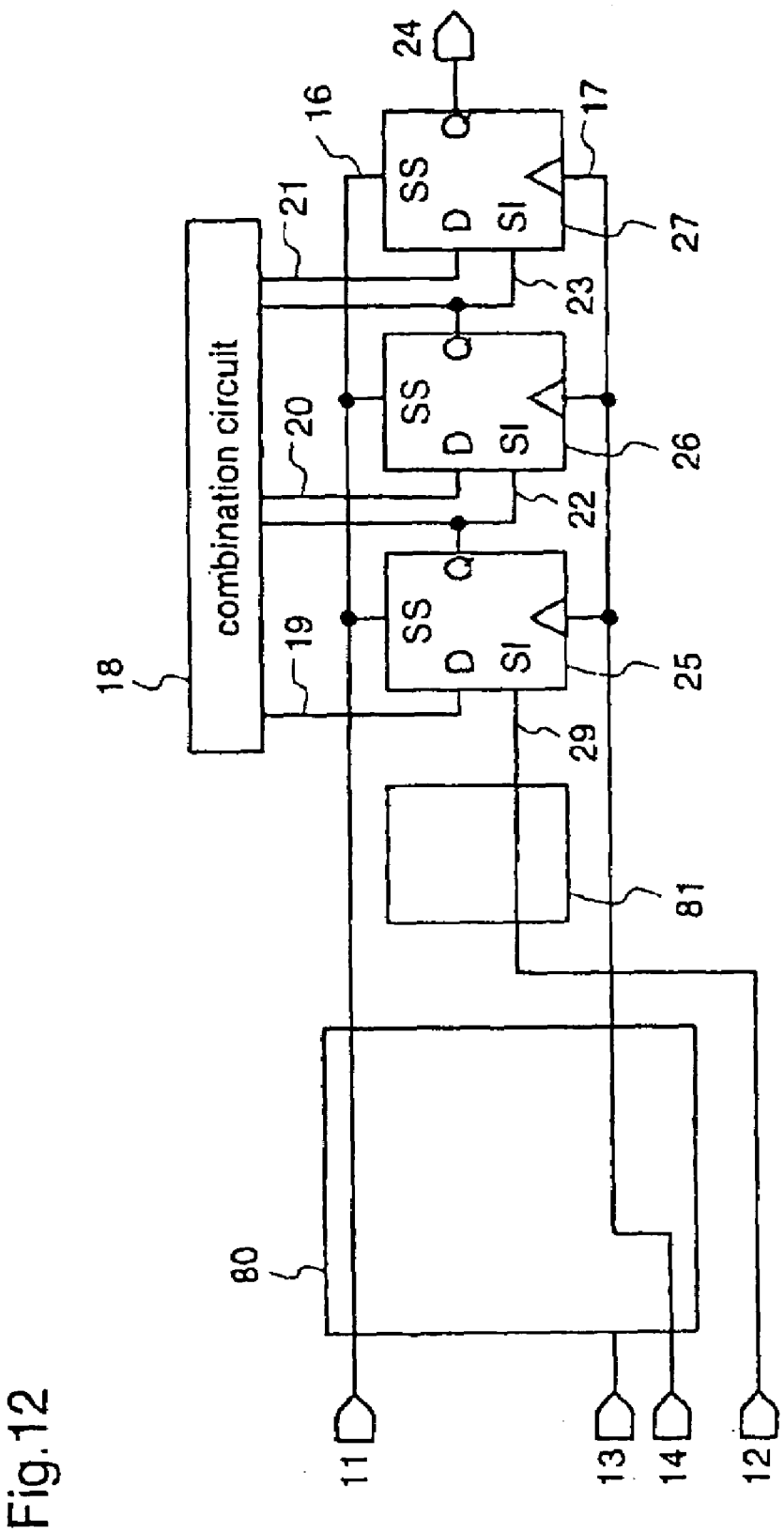
FIG. 12 is a block diagram illustrating the state where a scan control circuit and storage elements in a scan test circuit according to a third embodiment of the present invention are replaced with a replacement circuit.

FIG. 12 is a block diagram illustrating the scan test circuit according to the third embodiment. This scan test circuit is a circuit for generating a scan test pattern. In FIG. 12, the same reference numerals as those shown in FIG. 10 denote the same parts. In FIG. 12, the scan test circuit includes, instead of the scan control circuit 15 shown in FIG. 10, a replacement circuit 80 which connects the external input terminal 11 receiving the scan selection external signal directly to the scan selection internal signal line 16, and connects the external input terminal 14 receiving the test clock directly to the scan clock signal line 17. Further, the scan test circuit includes, instead of the storage element 28 shown in FIG. 10, a replacement circuit 81 which connects the external input terminal 12 receiving the scan-in data, directly to the output signal line 29 of the storage element 28. Other constituents are identical to those described for the second embodiment.

Figure 18:
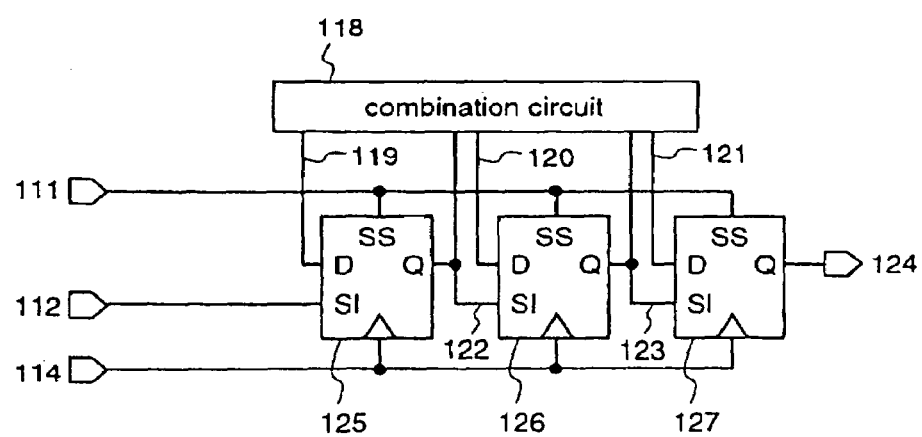
FIG. 18 is a block diagram illustrating the conventional scan test circuit.
Figure 19:
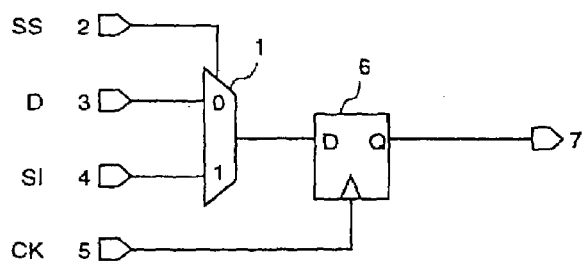
FIG. 19 is a block diagram illustrating a concrete example of a scan storage element of the conventional scan test circuit.

Since the scan test circuit according to the third embodiment is constructed as described above, the circuit construction becomes the same as that of the conventional scan test circuit shown in FIG. 18, whereby the above-mentioned scan design protocol is satisfied. Accordingly, when the scan test pattern generated by the scan test circuit according to the third embodiment is applied to the scan test described for the second embodiment, the scan test operation described for the second embodiment can be realized without infringing the scan design protocol.

[Embodiment 4]

It is considerable that the scan test according to the present invention and the conventional scan test are carried out in the same semiconductor integrated circuit. For example, it is considerable that a first block in the semiconductor integrated circuit executes the scan test described for the second embodiment while a second block executes the conventional scan test. In this case, however, there is a problem that passing of desired data from the first block to the second block cannot be satisfactorily carried out during the normal operation.

Figure 13:
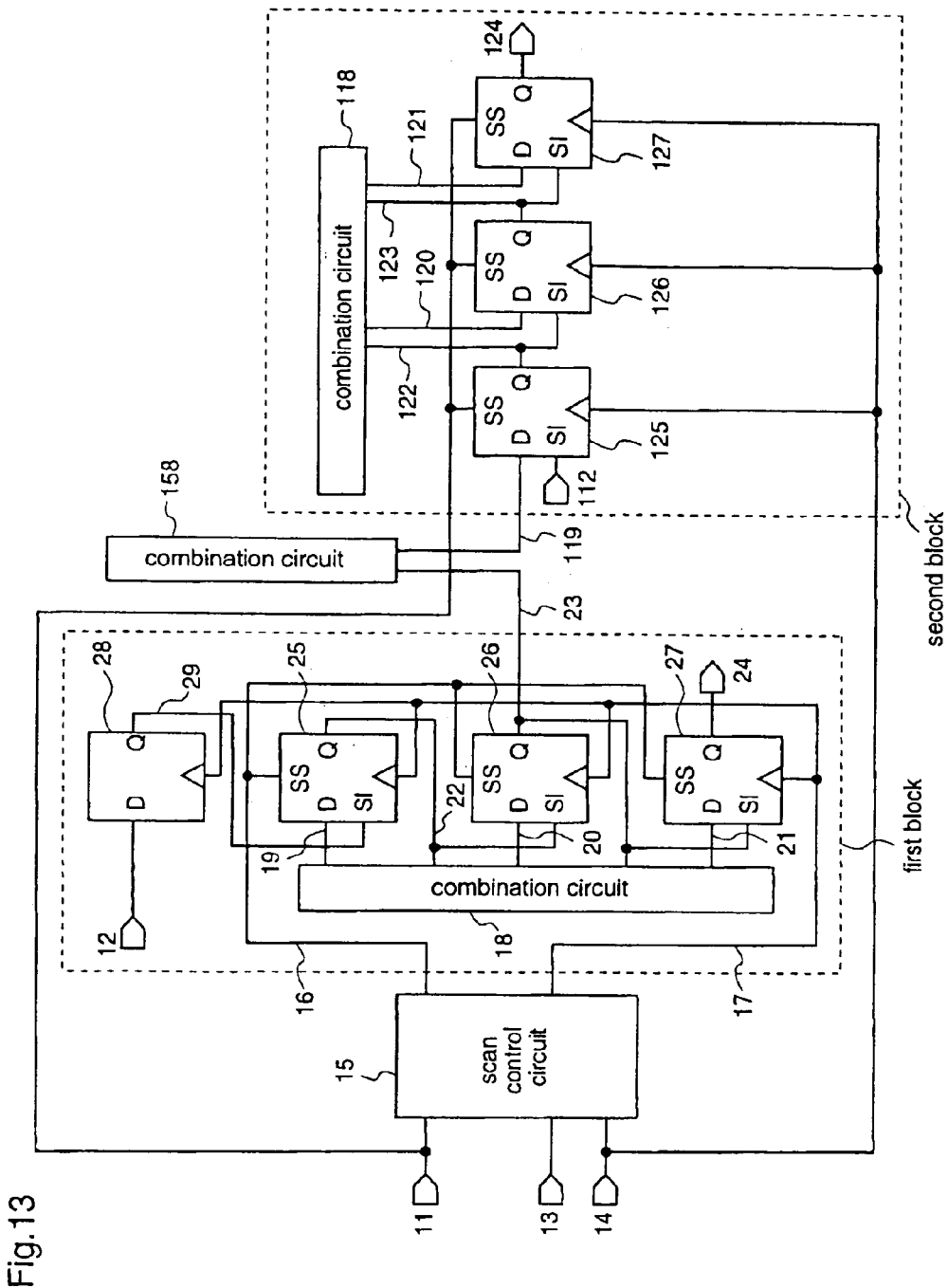
FIG. 13 is a block diagram illustrating the scan test circuit indicating the problem of the second embodiment.

In order to explain this problem, there is provided a scan test circuit shown in FIG. 13 in which a first block in a semiconductor integrated circuit executes the scan test according to the second embodiment while a second block executes the conventional scan test. In FIG. 13, the same reference numerals as those shown in FIGS. 10 and 18 denote the same parts.

In FIG. 13, a combination circuit 158 receives data from the output data line 23 of the scan storage element 26, and outputs the data to the normal data line 119. As for other circuit constituents, the first block is identical to FIG. 10, and the second block is identical to FIG. 18 except that the normal data line 119 is connected to the combination circuit 158.

Figure 14:
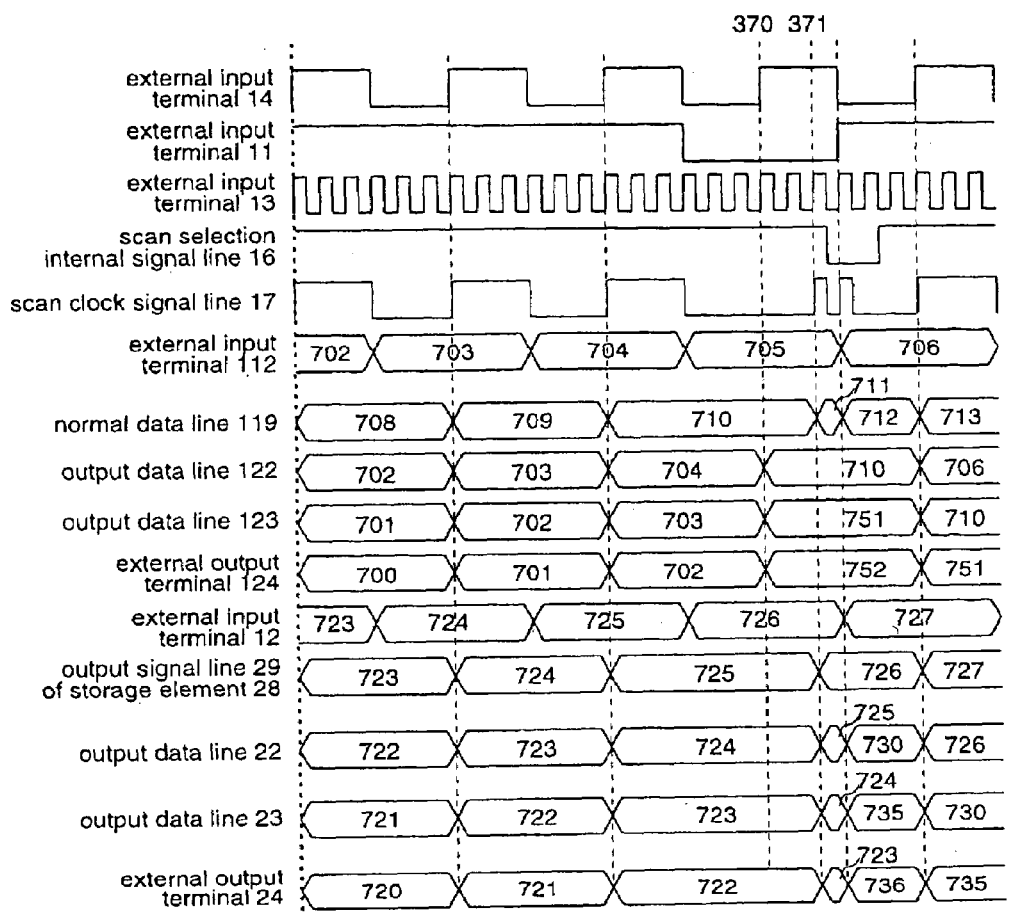
FIG. 14 is a timing chart illustrating the operation of the scan test circuit indicating the problem of the second embodiment.

FIG. 14 is a time chart for explaining the operation of the scan test circuit constructed as described above. In FIG. 14, the same reference numerals as those shown in FIG. 13 denote the same parts. Reference numeral 700 denote initial data that is stored in the scan storage element 127 in the scan operation, numeral 701 denotes initial data that is stored in the scan storage element 126 in the scan operation, numerals 702~706 denote scan-in data inputted to the external input terminal 112, numerals 708~713 denote normal data on the normal data line 119, numeral 751 denotes data stored in the scan storage element 126 during the normal operation, numeral 720 denotes initial data stored in the scan storage element 27 during the scan operation, numeral 721 denotes initial data that is stored in the scan storage element 26 during the scan operation, numeral 722 denotes initial data that is stored in the scan storage element 25 during the scan operation, numerals 723~727 denote scan-in data inputted to the external input terminal 12, numeral 730 denotes data that is stored in the scan storage element 25 during the normal operation, numeral 736 denotes data that is stored in the scan storage element 27 during the normal operation, and numerals 370 and 371 denote event timings. Other reference numerals indicate the waveforms of signals in the signal lines and external terminals corresponding to the reference numerals shown in FIG. 13.

Hereinafter, the operations of the normal data line 119, the scan storage element 26, and the scan storage element 125 will be described with reference to FIGS. 13 and 14. Since the operations of other constituents are identical to those described for the prior art and the second embodiment, repeated description is not necessary.

At the event timing 370, the (n−1)th scan storage element 26 is in the scan mode and performs the last-but-one scan operation. That is, the scan storage element 26 continues to hold and output the output data 723 of the scan storage element 25. The combination circuit 158 continues to receive the output data 723 and output the normal data 710 to the normal data line 119. The scan storage element 125 in the normal operation mode holds and outputs the normal data 710 in synchronization with the rising edge of the test clock inputted to the external input terminal 14. At the event timing 371, the (n−1)th scan storage element 27 performs the last scan operation in the scan mode. That is, it holds and outputs the output data 724 of the scan storage element 25 in synchronization with the rising edge of the normal operation clock at the external input terminal 13. Further, the combination circuit 158 receives the output data 724, and outputs the normal data 711 to the normal data line 119.

Originally, the scan storage element 125 must hold and output the output data 711 in the normal operation mode. However, since the last scan operation timing and the normal operation timing of the first block are different from those of the second block, the scan storage element 125 cannot hold and output the output data 711 in the normal operation mode, but holds and outputs the output data 710.

So, in this fourth embodiment, a required circuit is added between the first and second blocks so that passing of intended data between the blocks becomes possible even when the scan test according to the second embodiment and the conventional scan test are carried out simultaneously, and a stuck-at fault between the blocks can be detected.

Figure 15:
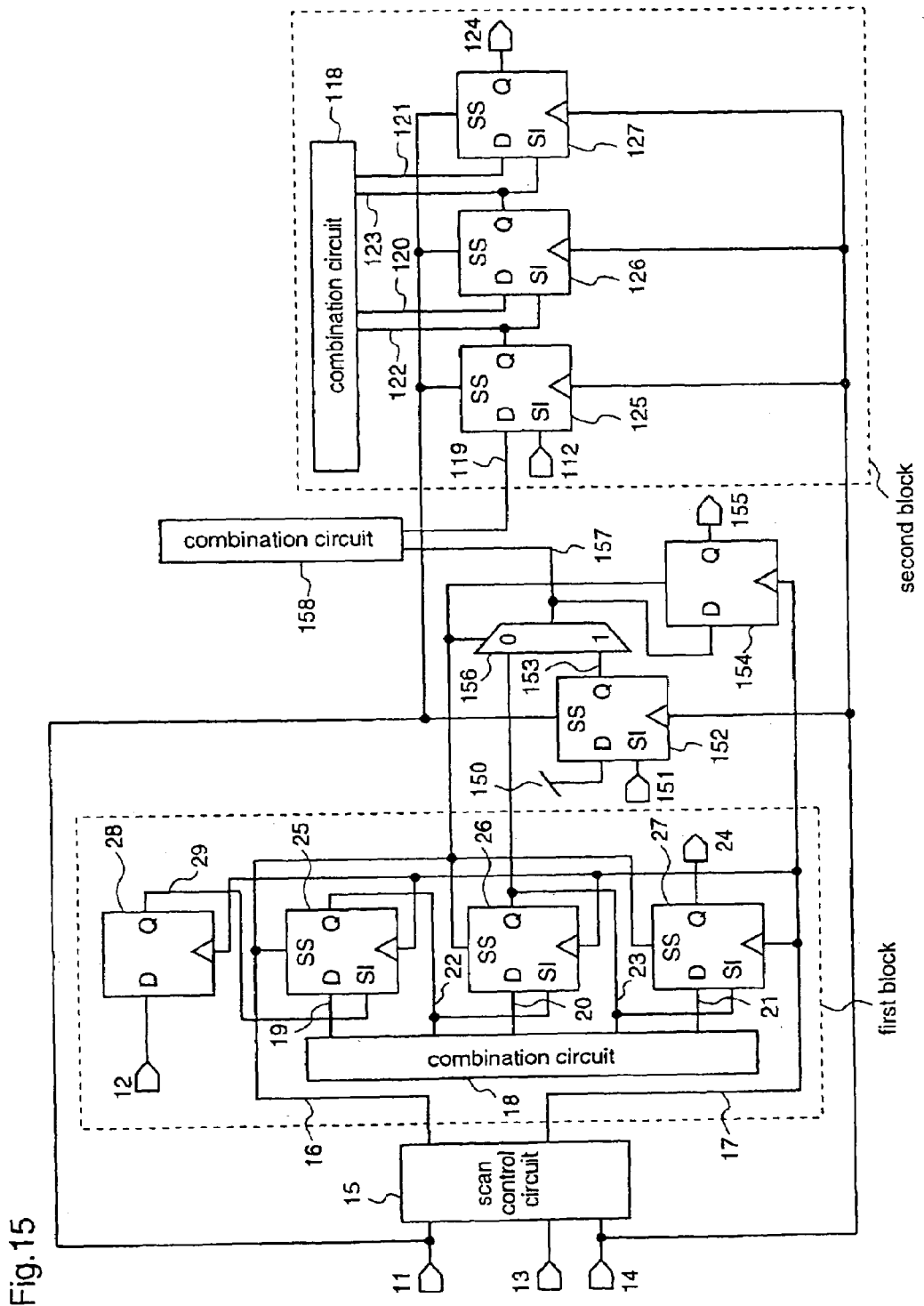
FIG. 15 is a block diagram illustrating a scan test circuit according to a fourth embodiment of the present invention.

FIG. 15 is a block diagram illustrating the scan test circuit according to the fourth embodiment. In FIG. 15, the same reference numerals as those shown in FIG. 13 denote the same parts. In FIG. 15, the scan test circuit is provided with a fixed data line 150, an external input terminal 151 to which scan-in data is inputted, a controllable scan storage element 152, an output data line 153 of the scan storage element 152, a monitor storage element 154, an external output terminal 155 for outputting the output data of the storage element 154, a selector circuit 156, and an output data line 157 of the selector circuit 156.

The fixed data line 150 is a data line to be connected to an element that always outputs a logic value "1", such as a power supply. The selector circuit 156 outputs the data from the output data line 23 when the scan selection internal signal supplied from the scan selection internal signal line 16 is "0", and outputs the data from the output data line 153 when the scan selection internal signal supplied from the scan selection internal signal line 16 is "1". Other circuit constituents are identical to those described with respect to FIG. 13.

Figure 16:
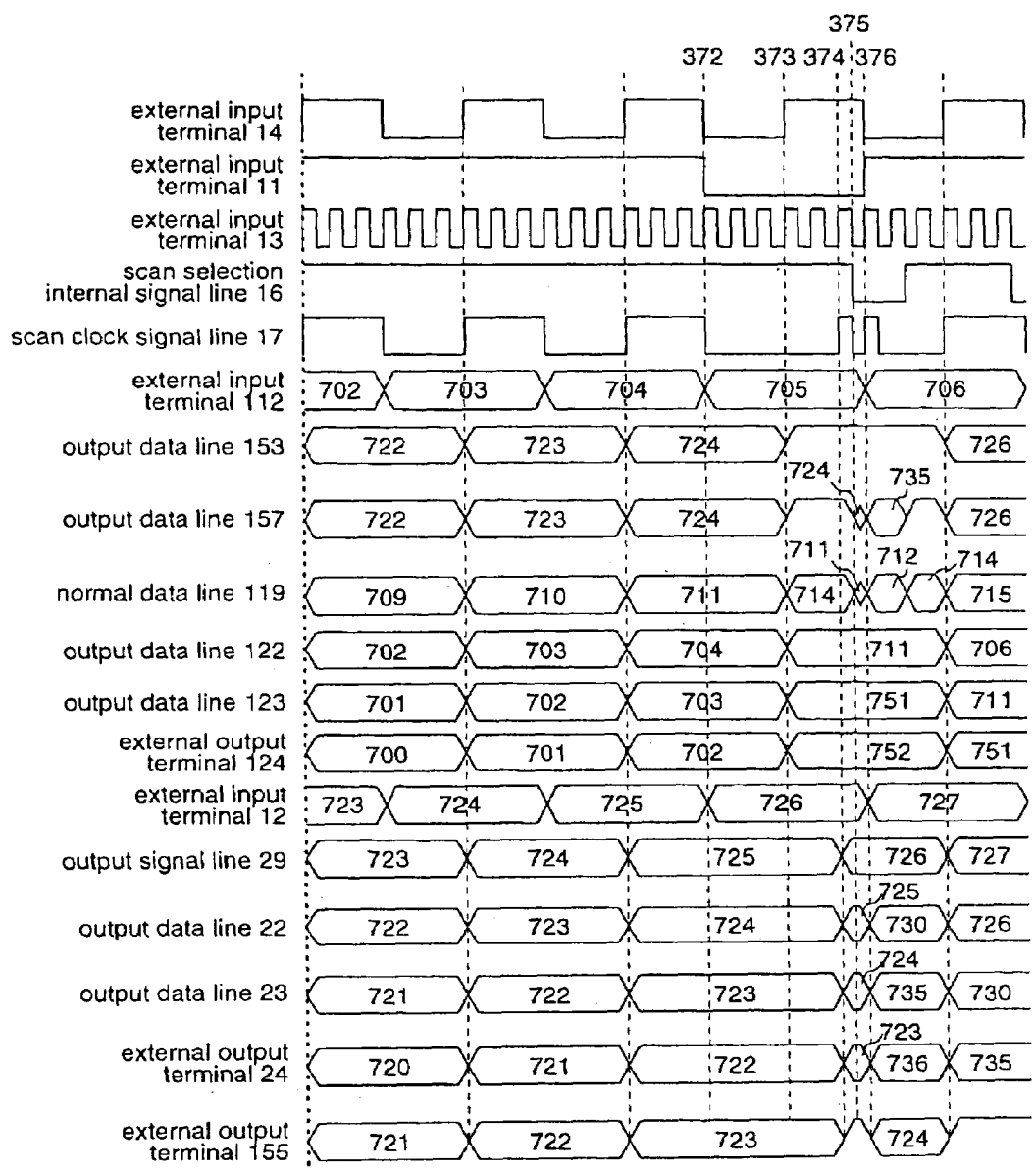
FIG. 16 is a timing chart illustrating the operation of the scan test circuit according to the fourth embodiment.

FIG. 16 is a time chart for explaining the operation of the scan test circuit constructed as described above. In FIG. 16, the same reference numerals as those shown in FIG. 14 denote the same parts. Reference numerals 714 and 715 denote normal data on the normal data line 119. Other reference numerals indicate the waveforms of signals at the signal lines and external terminals corresponding to those shown in FIGS. 13 and 15.

Hereinafter, the operations of the normal data line 119, the scan storage element 26, the scan storage element 125, the scan storage element 152, and the storage element 154 will be described with reference to FIGS. 15 and 16. Since the operations of other elements are identical to those described for the prior art and the second embodiment, repeated description is not necessary.

At the event timing 372, the (n−1)th scan storage element 26 performs the last-but-one scan operation in the scan mode. That is, the scan storage element 26 continues to hold and output the output data 723 of the scan storage element 25. On the other hand, since the scan selection internal signal from the scan selection internal signal line 16 is "1", the selector circuit 156 continues to output the output data 724 of the scan storage element 152. The combination circuit 158 receives the output data 724, and continues to output the normal data 711 to the normal data line 119. Further, since the scan selection external signal inputted to the external input terminal 11 transits to "0", the scan storage element 125 is switched to the normal operation mode.

At the event timing 373, the scan storage element 125 in the normal operation mode holds and outputs the normal data 711 in synchronization with the rising edge of the test clock inputted to the external input terminal 14. The selector circuit 156 outputs the output data "1" of the controllable scan storage element 152 because the scan selection internal signal from the scan selection internal signal line 16 is "1". The combination circuit 158 receives the output data "1" of the controllable scan storage element 152, and outputs the normal data 714 to the normal data line 119.

At the event timing 374, the (n−1)th scan storage element 26 holds and outputs the output data 724 of the scan storage element 25 in the scan mode. The selector circuit 156 continues to output the output data "1" of the controllable scan storage element 152 because the scan selection internal signal from the scan selection internal signal line 16 is "1". The combination circuit 158 receives the output data "1" of the controllable scan storage element 152, and continues to output the normal data 714 to the normal data line 119.

At the event timing 375, the selector circuit 156 outputs the output data 724 of the scan storage element 26 because the scan selection internal signal from the scan selection internal signal line 16 transits to "0". The combination circuit 158 receives the output data 724 of the scan storage element 26, and outputs the normal data 711 to the normal data line 119. However, since no clock enters into the scan storage element 125, the scan storage element 125 does not hold the data 711 from the normal data line 119.

At the event timing 376, the monitor storage element 154 holds the output data 724 of the scan storage element 26 and outputs it to the external output terminal 155 in synchronization with the rising edge of the normal operation clock inputted to the external input terminal 13. The selector circuit 156 outputs the output data 735 of the scan storage element 26 because the scan selection internal signal from the scan selection internal signal line 16 is "0". The combination circuit 158 receives the output data 735 of the scan storage element 26, and outputs the normal data 712 to the normal data line 119. On the other hand, since the scan selection external signal inputted to the external input terminal 11 transits to "1", the scan storage element 125 is switched to the scan mode.

As described above, according to the scan test circuit and the scan test control method of the fourth embodiment, the controllable scan storage element, the monitor storage element, and the selector circuit are provided between the first block executing the scan test of the second embodiment and the second block executing the conventional scan test, thereby enabling passing of desired data between the first block and the second block. Further, in the normal operation path between the first block and the second block, which comprises the output data line 23, the output data line 157, the combination circuit 158, and the normal data line 119, stuck-at faults in the output data line 157, the combination circuit 158, and the normal data line 119 are detected at the event timing 373, and a stuck-at fault in the output data line 23 is detected at the event timing 376. That is, stuck-at faults between the first block and the second block can also be detected.

While in this fourth embodiment a stuck-at fault is detected from the output data line 23 of the scan storage element 26 which is an operation path between the first and second blocks, the present invention is not restricted thereto. A stuck-at fault in the output data line of another storage element in the first block may be detected.

[Embodiment 5]

In the fourth embodiment of the invention, the selector circuit 156 exists in the first path between the scan storage element 152 and the scan storage element 125 and in the second path between the scan storage element 26 and the storage element 154. Therefore, a scan test pattern can be generated for only one of the first path and the second path. So, in this fifth embodiment, the selector circuit 156 is replaced with another circuit when generating a scan test pattern, whereby scan test patterns can be generated for both of the first path and the second path.

Figure 17:
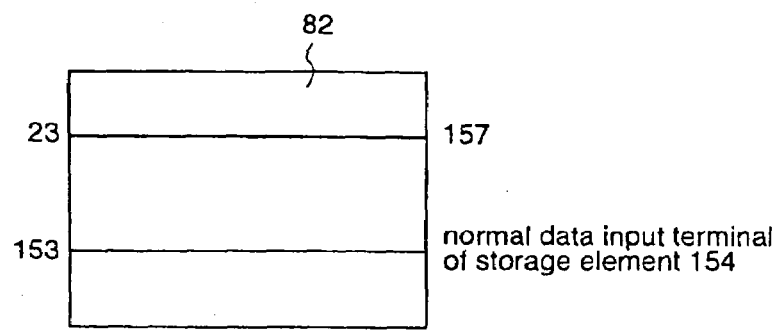
FIG. 17 is a diagram in which the selector circuit of the scan test circuit according to the fourth embodiment is replaced with another circuit, according to a fifth embodiment of the present invention.

FIG. 17 is a block diagram illustrating a replacement circuit that is included in the scan test circuit according to the fifth embodiment, instead of the selector circuit 156 shown in FIG. 15. In FIG. 17, the same reference numerals as those shown in FIG. 15 denote the same parts. In the replacement circuit 82 that is provided instead of the selector circuit 156, the output data line 23 is connected to the output data line 157, and the output data line 153 is connected to the normal data input terminal of the storage element 154.

Since the scan test circuit according to the fifth embodiment is constituted as described above, when the scan test pattern that is generated in the scan test circuit of the fifth embodiment is applied to the scan test according to the fourth embodiment, the scan test operation described for the fourth embodiment is realized.

In the above-mentioned embodiments of the present invention, the scan selection internal signal is generated, data is shifted in the n-th scan storage element, and the normal operation clock for performing the normal operation is generated. Therefore, the normal operation clock mask signal is generated in the scan selection internal signal generation circuit having the m-stage (m=1) shift register 45 and the (m+2)-stage shift register 46 as shown in FIG. 3. However, the generation timing of the normal operation clock mask signal may be changed by constituting an m-stage shift register in which the m is an integer larger than 1 (m>1), thereby changing the generation timing of the scan selection internal signal and the generation timing of the normal operation clock for shifting data in the n-th scan storage element and performing the normal operation.

Figure 9:
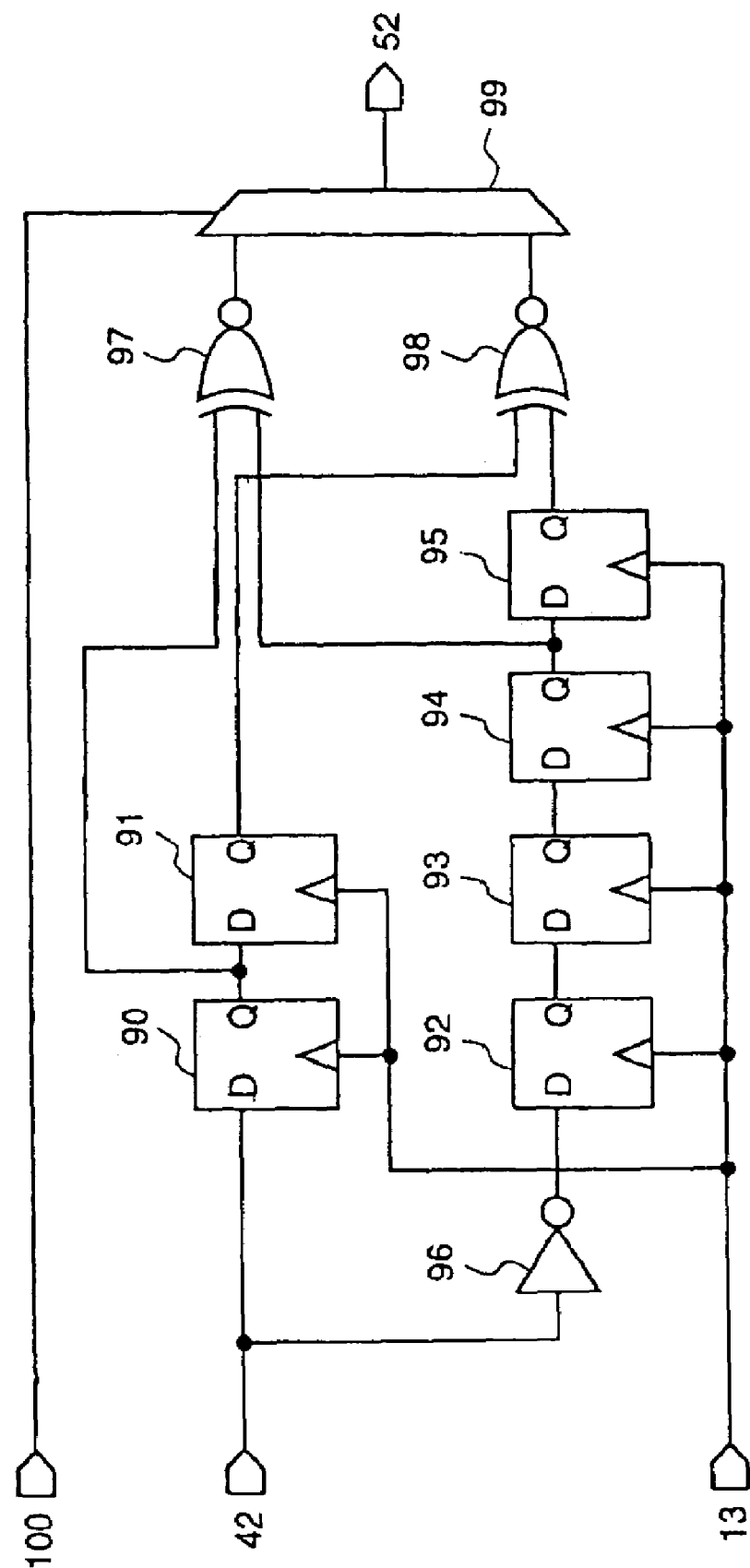
FIG. 9 is a block diagram illustrating a concrete example of a circuit construction in which the scan selection internal signal generation circuit according to the first embodiment can select plural generation timings of a normal operation clock mask signal.

Further, the constructions of the inverter circuit 44, the m-stage shift register 45 (m: integer, m>0), the (m+2)-stage shift register 46, and the EXNOR circuit 49 may be modified as shown in FIG. 9. That is, in FIG. 9, the output signals of plural EXNOR circuits are selectable by a selector circuit, whereby plural generation timings of the normal operation clock can be selected without changing the number of stages of the shift register. As a result, it is possible to arbitrarily select the generation timing of the scan selection internal signal and the generation timing of the normal operation clock for shifting data in the n-th scan storage element and performing the normal operation.

Further, in the above-mentioned embodiments, the shift-in data, normal operation clock, test clock, and scan selection external signal are supplied from the outside of the semiconductor integrated circuit. However, the shift-in data, normal operation clock, test clock, and scan selection external signal, which are generated in the semiconductor integrated circuit, may be input to the scan test circuit of the present invention.

Further, in the fourth embodiment of the present invention, one monitor storage element is prepared for one inter-block normal operation path. However, when plural inter-block normal operation paths are provided, output data lines of plural selector circuits may be bundled using an AND circuit or the like so that data from the data lines are input to a monitor storage element between arbitrary blocks, whereby the number of monitor storage elements can be decreased.

The scan test control method and the scan test circuit according to the present invention are suitable for detecting a stuck-at fault and a delay fault in a semiconductor integrated circuit.

What is claimed is:

1. A scan test control method for a scan test circuit, said scan test circuit having
    a scan chain including n pieces of scan storage elements in which n is an integer that is greater than 1 and
    a storage element which is provided in front of the scan chain, wherein the method includes the steps of:
    independently controlling a frequency of a first clock to be used for shifting data into the storage element and the first to n–1 th scan storage elements, and
    independently controlling a frequency of a second clock to be used for shifting data into the nth scan storage element and performing normal operation.

2. The scan test control method of claim 1, wherein the frequency of the first clock and the frequency of the second clock are different from each other.

3. The scan test control method of claim 1, wherein the frequency of the second clock is a clock frequency to be used in the normal operation.

4. A scan test circuit comprising:
    a scan chain having n pieces of scan storage elements in which n is an integer that is greater than 1;
    a storage element that is provided in front of the scan chain;
    a scan clock generation circuit for receiving first and second clocks, and outputting one of the first clock and the second clock as a scan clock for operating the plural scan storage elements and the storage element; and
    a selection circuit for selecting the first clock as the scan clock to be used for shifting data into the storage element and the first to n–1th scan storage elements, and selecting the second clock as the scan clock to be used for shifting data into the nth scan storage element and performing normal operation.

5. The scan test circuit of claim 4 further including a scan selection signal generation circuit which receives, from the outside, a scan selection external signal for switching between normal operation and scan test operation, and generates a scan selection internal signal for selectively switching between normal operation and operation for shifting data into the plural scan storage elements in synchronization with the second clock.

6. The scan test circuit of claim 5, wherein the scan selection signal generation circuit generates a control signal for generating an arbitrary number of the second clocks.

7. The scan test circuit of claim 6, wherein the scan selection signal generation circuit switches between a first timing at which the scan clock generation circuit generates the second clock as the scan clock, and a second timing at which the scan selection internal signal is generated.

8. The scan test circuit of claim 7, wherein the scan selection signal generation circuit arbitrarily selects one of the first timing and the second timing.

9. A scan test control method for a scan test circuit, said scan test circuit comprising:
a scan chain having n pieces of scan storage elements, in which n is an integer that is greater than 1;
a storage element that is provided in front of the scan chain;
a scan clock generation circuit for receiving first and second clocks, said method including the step of
outputting one of the first clock and the second clock as a scan clock for operating the plural scan storage elements and the storage element;
a selection circuit for selecting the first clock as the scan clock to be used for shifting data into the storage element and the first to n-th scan storage elements, and in which the method further includes the step of
selecting the second clock as the scan clock to be used for shifting data into the nth scan storage element and performing normal operation; and
a scan selection signal generation circuit which receives, from the outside, a scan selection external signal for switching between normal operation and scan test operation, wherein according to the method a scan selection internal signal is generated by said scan selection signal generation circuit for selectively switching between normal operation and operation for shifting data into the plural scan storage elements in synchronization with the second clock: and in which the method further includes the steps of
replacing when generating a scan test pattern, the scan clock generation circuit with a circuit that connects a terminal to which the first clock is input, directly to a signal line from which the scan clock is output,
replacing the scan selection signal generation circuit with a circuit that connects a terminal to which the scan selection external signal is input, directly to a signal line from which the scan selection internal signal is output, and
replacing the storage element with a circuit that connects a signal line to which data in the storage element is input, directly to a signal line from which the data is output.

10. A scan test control method for a scan test circuit, said scan test circuit comprising
a first block having a first scan test circuit that operates in synchronization with first and second clocks, and
a second block having a second scan test circuit that is synchronized with only the first clock,
wherein according to the method,
the first block receives a first scan selection signal that is synchronized with the second clock and indicates switching timing between normal operation and scan test operation of the first scan test circuit, and the second block receives a second scan selection signal that is synchronized with the first clock and indicates switching timing between normal operation and scan test operation of the second scan test circuit,
wherein the normal operation time of the scan test in the first block is different from the normal operation time of the scan test in the second block.

11. A scan test circuit comprising a first block having a first scan test circuit that operates in synchronization with first and second clocks, and a second block having a second scan test circuit that is synchronized with only the first clock, said scan test circuit comprising:
a plurality of first storage elements synchronized with the first clock,
a plurality of second storage elements synchronized with the first and second clocks,
a selection circuit for selecting either a first path between the plural first storage elements and the second block, or a second path between the plural second storage elements and the first block, as a path for passing data from the first block to the second block, and
said first storage elements, second storage elements, and selection circuit being provided between the first block and the second block.

12. The scan test circuit of claim 11, wherein the plurality of first storage elements and the plurality of second storage elements are a plurality of controllable scan storage elements for controlling a signal inputted to the second block, or a plurality of monitor storage elements for holding a signal outputted from the first block.

13. The scan test circuit of claim 12, wherein the plurality of monitor storage elements are constituted by a single monitor storage element.

14. The scan test circuit of claim 13, wherein the selection circuit is replaced with a circuit which separates the first path from the second path, when generating a scan test pattern.

* * * * *

UNITED STATES PATENT AND TRADEMARK OFFICE
CERTIFICATE OF CORRECTION

PATENT NO. : 7,155,649 B2
APPLICATION NO. : 10/722752
DATED : December 26, 2006
INVENTOR(S) : Toshinobu Nakao, Shinji Ozaki and Tomohisa Sezaki It is certified that error appears in the above-identified patent and that said Letters Patent is hereby corrected as shown below:

Column 13, Line 36. The phrase "output signal "1" " in incorrect and should be replaced with --output signal "0"--.

In the Claims, relating to Claim 9, Column 23, Line 29. The phrase "n-th" is incorrect and should be replaced with --n-1th--.

Signed and Sealed this

Thirteenth Day of March, 2007

JON W. DUDAS
*Director of the United States Patent and Trademark Office*